United States Patent
Masuda et al.

(10) Patent No.: US 8,187,966 B2
(45) Date of Patent: May 29, 2012

(54) MANUFACTURING METHOD FOR SEMICONDUCTOR INTEGRATED CIRCUIT DEVICE

(75) Inventors: Hiroyuki Masuda, Tokyo (JP); Hiroshi Oshita, Tokyo (JP); Nobuhiro Konishi, Ome (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 332 days.

(21) Appl. No.: 12/411,387

(22) Filed: Mar. 25, 2009

(65) Prior Publication Data

US 2009/0286392 A1 Nov. 19, 2009

(30) Foreign Application Priority Data

Mar. 26, 2008 (JP) ................. 2008-080931

(51) Int. Cl.
 *H01L 21/4763* (2006.01)
(52) U.S. Cl. ........ 438/618; 438/631; 438/633; 438/691; 438/692; 257/E21.585
(58) Field of Classification Search .......... 438/631–633, 438/637, 690–693
See application file for complete search history.

(56) References Cited

U.S. PATENT DOCUMENTS

| | | | |
|---|---|---|---|
| 6,897,150 B1 | 5/2005 | Aoki et al. | |
| 6,935,930 B2 | 8/2005 | Fujita | |
| 6,992,009 B2 * | 1/2006 | Kodera et al. | 438/691 |
| 7,188,630 B2 | 3/2007 | Flake et al. | |
| 2003/0032292 A1 * | 2/2003 | Noguchi | 438/692 |

FOREIGN PATENT DOCUMENTS

| | | |
|---|---|---|
| JP | 2001-148385 A | 5/2001 |
| JP | 2007-511894 A | 5/2007 |
| JP | 2007-150359 A | 6/2007 |

* cited by examiner

*Primary Examiner* — Thanh Nguyen
(74) *Attorney, Agent, or Firm* — Miles & Stockbridge P.C.

(57) ABSTRACT

A Cu-CMP step applied to processes for 130 nm, 90 nm, and 65 nm technical nodes or the like mainly employs slurry to which an anticorrosive agent is added for preventing corrosion of Cu wiring. The inventors of the present application have studied and clearly found that in the Cu-CMP step using the slurry with the anticorrosive agent added thereto, the anticorrosive agent often forms complexes with Cu, which remain as foreign matter on a wafer in large quantity, leading to a reduction in yield, and in reliability of TDDB characteristics of the Cu wiring. In the invention of the present application, a post-CMP cleaning process involves applying wet cleaning to a wafer by supplying a cleaning solution, such as a chemical solution or pure water, to a device surface of the wafer substantially in a vertical direction with respect to the horizontal device surface, while rotating the wafer substantially about its center in the horizontal plane. The rotation speed of the wafer is set low such that the thickness of the cleaning solution over the entire device surface becomes substantially uniform.

1 Claim, 23 Drawing Sheets

Fig.9

POST-CMP CLEANING PROCESS:

| CONDITIONS | POST-Ta-CMP WATER POLISHING | CLEANING STAGE 1&2 | | | | CLEANING STAGE 3 | | | | DRYING |
|---|---|---|---|---|---|---|---|---|---|---|
| | | CHEMICAL-SOLUTION BRUSH CLEANING | | | RINSING WITH WATER | | CHEMICAL-SOLUTION PEN BRUSH CLEANING | | RINSING WITH WATER | |
| | | NUMBER OF REVOLUTIONS OF WAFER [rpm] | NUMBER OF REVOLUTIONS OF BRUSH [rpm] | TIME (SECOND) | NUMBER OF REVOLUTIONS OF WAFER [rpm] | TIME (SECOND) | NUMBER OF REVOLUTIONS OF WAFER [rpm] | TIME (SECOND) | NUMBER OF REVOLUTIONS OF WAFER [rpm] | TIME (SECOND) | NUMBER OF REVOLUTIONS OF STAGE [rpm] |
| | DONE | 10 | 200 | 60 | 10 | 30 | 300 | 27 | 10 | 63 | 300 |

(NOTE) SWINGING OF PEN BRUSH IS PERFORMED ONLY ONE TIME FROM CENTER OF WAFER TO PERIPHERY THEREOF

Fig.25

POST-CMP CLEANING PROCESS:
COMPARATIVE EXAMPLE

| CONDITIONS | POST-Ta-CMP WATER POLISHING | CLEANING STAGE 1&2 | | | | CLEANING STAGE 3 | | | | DRYING |
|---|---|---|---|---|---|---|---|---|---|---|
| | | CHEMICAL-SOLUTION BRUSH CLEANING | | RINSING WITH WATER | | CHEMICAL-SOLUTION PEN BRUSH CLEANING | | RINSING WITH WATER | | |
| | | NUMBER OF REVOLUTIONS OF WAFER [rpm] | NUMBER OF REVOLUTIONS OF BRUSH [rpm] | TIME (SECOND) | NUMBER OF REVOLUTIONS OF WAFER [rpm] | TIME (SECOND) | NUMBER OF REVOLUTIONS OF WAFER [rpm] | TIME (SECOND) | NUMBER OF REVOLUTIONS OF WAFER [rpm] | TIME (SECOND) | NUMBER OF REVOLUTIONS OF STAGE [rpm] |
| | DONE | 100 | 150 | 60 | 100 | 30 | / | / | 300 | 63 | 300 |

US 8,187,966 B2

MANUFACTURING METHOD FOR SEMICONDUCTOR INTEGRATED CIRCUIT DEVICE

CLAIM OF PRIORITY

The Present application claims priority from Japanese application JP 2008-80931 filed on Mar. 26, 2008, the content of which is hereby incorporated by reference into this application.

BACKGROUND OF THE INVENTION

The present invention relates to techniques effectively applied to embedded wiring technology in a manufacturing method for a semiconductor integrated circuit device (or a semiconductor device).

Japanese Unexamined Patent Publication No. 2007-150359 (Patent Document 1) discloses that an atmosphere in an integrated chemical mechanical polishing (CMP) and cleaning device is transformed to inert gas in a copper damascene interconnect process.

Japanese Unexamined Patent Publication No. 2001-148385 (Patent Document 2) or U.S. Pat. No. 6,897,150 (Patent Document 3) discloses that a corrosion prevention process using a benzo-tri-azole (BTA) is applied in cleaning after the CMP process of the copper damascene interconnect process.

Japanese Unexamined Patent Application Publication (Translation of a PCT application) No. 2007-511894 (Patent Document 4) or U.S. Pat. No. 7,188,630 (Patent Document 5) discloses that a cleaning solution containing an antiseptic agent is used for cleaning after the CMP processing of the copper damascene interconnect process.

[Patent Document 1] Japanese Unexamined Patent Publication No. 2007-150359
[Patent Document 2] Japanese Unexamined Patent Publication No. 2001-148385
[Patent Document 3] U.S. Pat. No. 6,897,150
[Patent Document 4] Japanese Unexamined Patent Application Publication (Translation of a PCT application) No. 2007-511894
[Patent Document 5] U.S. Pat. No. 7,188,630

SUMMARY OF THE INVENTION

A Cu-CMP step applied to processes for 130 nm, 90 nm, and 65 nm technical nodes and the like mainly employs slurry to which an antiseptic agent is added for preventing corrosion of Cu wiring. The inventors of the present application have clearly found that in the Cu-CMP step using the slurry with the antiseptic agent added thereto, the antiseptic agent often forms complexes with Cu, which remain as foreign matter on a wafer in large quantity, leading to reduction in yield, and in reliability of characteristics of the Cu wiring, such as a time dependent dielectric breakdown (TDDB) characteristic.

Further, the remaining foreign matter detected in large quantity interrupts detection of other defects in detecting the defects, which may delay taking measures against the reduction in yield due to a defect other than the specific defect. Thus, the inventors have tried strong cleaning conditions which can reduce foreign matter, but found that such a cleaning condition clearly promotes corrosion of the Cu element, which leads to reduction in reliability of the Cu wiring, short-circuiting the wiring, and also reduction in yield due to open. Thus, a cleaning condition is required which can improve removal performance of foreign matter remaining on the wafer as complexes of the antiseptic agent and Cu, and also corrosion tolerance of the Cu.

It is an object of the present invention to provide a manufacturing process for a semiconductor integrated circuit device with high reliability.

The above, other objects and novel features of the invention will become apparent from the description of the present specification and the accompanying drawings.

The outline of representative aspects of the invention disclosed in the present application will be briefly described below.

That is, in the invention of the present application, a post-CMP cleaning process involves applying wet cleaning to a wafer by supplying a cleaning solution, such as a chemical solution or pure water, to a device surface of the wafer in a vertical direction with respect to the horizontal device surface, while rotating the wafer substantially about its center in a horizontal plane. The rotation speed of the wafer is set low, that is, equal to or more than one time per minute and less than 30 times per minute such that the thickness of the cleaning solution over the entire device surface becomes substantially uniform.

Effects obtained by the representative aspects of the invention disclosed in the present application will be briefly described below.

That is, since the rotation speed of the wafer about its axis is set low such that the thickness of the cleaning solution becomes substantially uniform in the post CMP cleaning, the concentration of dissolved oxygen over the device surface of the wafer is made uniform, which prevents corrosion of the embedded wiring due to the nonuniform concentration of the dissolved oxygen, while enabling the effective cleaning process.

BRIEF DESCRIPTION OF THE DRAWINGS

FIGS. 1A, 1B, and 1C explain the principle of wet cleaning after damascene CMP in the manufacturing method for a semiconductor integrated circuit device according to one embodiment of the present application, in which FIG. 1A is a perspective view of an upper surface of a wafer, FIG. 1B is a side view of the wafer in high-speed rotation about its axis, and FIG. 1C is a side view of the wafer in low-speed rotation about its axis;

FIG. 9 is a table summarizing the detailed process flow of wet cleaning after the damascene CMP (containing processing similar to the cleaning in a part of the polishing process) in the manufacturing method for the semiconductor integrated circuit device according to the embodiment of the present application;

FIGS. 20A and 20B explain the effect (first example) of the chemical solution or pure water nozzle used in wet cleaning (roll brush cleaning, rinsing, pen brush cleaning, and the like) after the CMP in the manufacturing method for the semiconductor integrated circuit device according to the embodiment of the present application, in which FIG. 20A is a top view of the wafer and FIG. 20B is a schematic sectional view of the wafer;

FIGS. 21A and 21B explain the effect (second example) of the chemical solution or pure water nozzle used in wet cleaning (roll brush cleaning, rinsing, pen brush cleaning, and the like) after the CMP in the manufacturing method for the semiconductor integrated circuit device according to the embodiment of the present application, in which FIG. 21A is a top view of the wafer and FIG. 21B is a schematic sectional view of the wafer;

FIG. 25 is an explanatory table of conditions of the comparative example, for explaining process conditions for the wet cleaning method after the CMP corresponding to the comparative example of FIG. 23.

DETAILED DESCRIPTION OF THE PREFERRED EMBODIMENTS

[Summary of the Preferred Embodiments]

Figure 1:
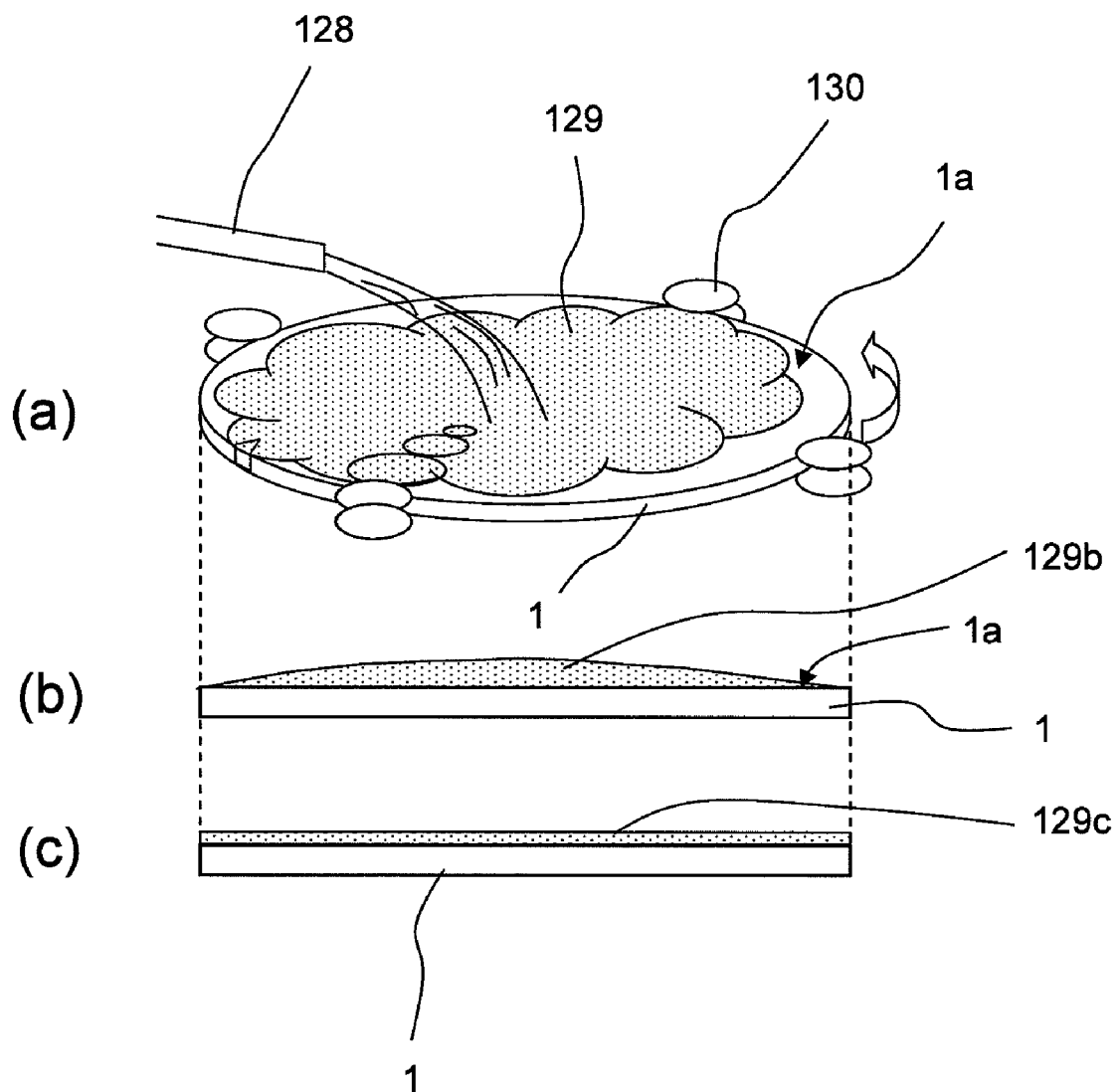

First, the summary of representative embodiments of the invention disclosed in the present application will be described below.

A manufacturing method for a semiconductor integrated circuit device includes the steps of:

(a) forming a wiring trench in a first insulating film over a first main surface of a wafer;

(b) forming a metal member layer in the wiring trench and over the first insulating film so as to fill the wiring trench therewith;

(c) forming an embedded wiring by removing the metal member layer located outside the wiring trench by a CMP process;

(d) after the step (c), applying a wet cleaning process to the first main surface side of the wafer with the embedded wiring formed therein by rotating the wafer about an axis thereof in a plane including the first main surface; and (e) after the step (d), drying the first main surface side of the wafer, wherein a rotation speed of the wafer about the axis thereof is equal to or more than one time per minute, and less than 30 times per minute.

2. In the manufacturing method for a semiconductor integrated circuit device according to Item 1, the rotation speed is equal to or more than twice per minute, and less than 22 times per minute.

3. In the manufacturing method for a semiconductor integrated circuit device according to Item 1, the rotation speed is equal to or more than 4 times per minute, and less than 16 times per minute.

4. In the manufacturing method for a semiconductor integrated circuit device according to any one of Items 1 to 3, the steps (c) to (e) are performed in a CMP processor.

5. In the manufacturing method for a semiconductor integrated circuit device according to any one of Items 1 to 4, the wet cleaning process includes:
 (d1) a first chemical solution cleaning process performed by a first rotary roll brush;
 (d2) a second chemical solution cleaning process performed by a second rotary roll brush after the first chemical solution cleaning process; and
 (d3) a third chemical solution cleaning process performed by a rotary pen brush after the second chemical solution cleaning process.

6. In the manufacturing method for a semiconductor integrated circuit device according to any one of Items 1 to 4, the wet cleaning process includes:
 (d1) a first chemical solution cleaning process performed by a first rotary roll brush;
 (d2) a second chemical solution cleaning process performed by a second rotary roll brush after the first chemical solution cleaning process;
 (d3) a third chemical solution cleaning process performed by a rotary pen brush after the second chemical solution cleaning process; and
 (d4) a first rinsing process performed without a brush after the third chemical solution cleaning process.

7. In the manufacturing method for a semiconductor integrated circuit device according to any one of Items 1 to 4, the wet cleaning process includes:
 (d1) a first chemical solution cleaning process performed by a first rotary roll brush;
 (d2) a second chemical solution cleaning process performed by a second rotary roll brush after the first chemical solution cleaning process;
 (d3) a third chemical solution cleaning process performed by a rotary pen brush after the second chemical solution cleaning process;
 (d4) a first rinsing process performed without a brush after the third chemical solution cleaning process; and
 (d5) a second rinsing process performed without a brush between the second chemical solution cleaning process and the third chemical solution cleaning process.

8. In the manufacturing method for a semiconductor integrated circuit device according to any one of Items 1 to 4, the wet cleaning process includes:
 (d1) a first chemical solution cleaning process performed by a first rotary roll brush;
 (d2) a second chemical solution cleaning process performed by a second rotary roll brush after the first chemical solution cleaning process;
 (d3) a third chemical solution cleaning process performed by a rotary pen brush after the second chemical solution cleaning process;
 (d4) a first rinsing process performed without a brush performed after the third chemical solution cleaning process;
 (d5) a second rinsing process performed without a brush performed between the second chemical solution cleaning process and the third chemical solution cleaning process; and
 (d6) a third rinsing process performed without a brush performed between the first chemical solution cleaning process and the second chemical solution cleaning process.

9. In the manufacturing method for a semiconductor integrated circuit device according to any one of Items 5 to 8, the rotation speed of the rotary roll brush is equal to or more than 160 times per minute and less than 500 times per minute.

10. In the manufacturing method for a semiconductor integrated circuit device according to any one of Items 5 to 8, the rotation speed of the rotary roll brush is equal to or more than 170 times per minute, and less than 400 times per minute.

11. In the manufacturing method for a semiconductor integrated circuit device according to any one of Items 5 to 8, the rotation speed of the rotary roll brush is equal to or more than 180 times per minute, and less than 300 times per minute.

12. In the manufacturing method for a semiconductor integrated circuit device according to any one of Items 6 to 8, the number of pure water nozzles in the rinsing process is plural.

13. In the manufacturing method for a semiconductor integrated circuit device according to any one of Items 5 to 8, swinging of the rotary pen brush is performed one time from a point around a center of the wafer to an outer periphery thereof.

14. In the manufacturing method for a semiconductor integrated circuit device according to any one of Items 1 to 13, the embedded wiring includes a barrier metal layer as a lower layer, and a copper alloy layer as an upper layer containing copper as a principal component.

15. The manufacturing method for a semiconductor integrated circuit device according to any one of Items 1 to 14 further includes the step of:
 (f) after the step (e), forming an insulating barrier film over the embedded wiring and the first insulating film.

16. In the manufacturing method for a semiconductor integrated circuit device according to any one of Items 1 to 15, the step (c) further includes the sub-steps of:
 (c1) removing a copper alloy layer containing copper in the metal member layer located outside the wiring trench as a principal component by a first CMP process; and
 (c2) removing a barrier metal layer in the metal member layer outside the wiring trench by a second CMP process.

17. In the manufacturing method for a semiconductor integrated circuit device according to any one of Items 1 to 15, the step (c) further includes the sub-steps of:
 (c1) removing a copper alloy layer containing copper in the metal member layer outside the wiring trench as a principal component by a first CMP process; and
 (c2) removing a barrier metal layer in the metal member layer outside the wiring trench by a second CMP process using slurry containing an antiseptic agent.

18. In the manufacturing method for a semiconductor integrated circuit device according to any one of Items 1 to 17, the wet cleaning process includes a cleaning step with the chemical solution or pure water using a rotary roll brush.

19. In the manufacturing method for a semiconductor integrated circuit device according to any one of Items 1 to 18, the embedded wiring includes a barrier metal layer as a lower layer, and a copper alloy layer as an upper layer containing copper as a principal component, and the barrier metal layer includes a film containing tantalum as a principal component.

20. The manufacturing method for a semiconductor integrated circuit device according to any one of Items 1 to 19 further includes the step of:
 (f) after the step (e), forming an insulating barrier film over the embedded wiring and the first insulating film, wherein the insulating barrier film includes an SiCN film.

21. In the manufacturing method for a semiconductor integrated circuit device according to any one of claims 1 to 20, the wet cleaning process further includes:

(d1) a first chemical solution cleaning process performed by a first rotary roll brush.

22. In the manufacturing method for a semiconductor integrated circuit device according to any one of claims 1 to 20, the wet cleaning process further includes:
(d1) a first chemical solution cleaning process performed by a first rotary roll brush; and
(d2) a second chemical solution cleaning process performed by a second rotary roll brush after the first chemical solution cleaning process.

23. In the manufacturing method for a semiconductor integrated circuit device according to any one of claims 1 to 20, the wet cleaning process further includes:
(d3) a third chemical solution cleaning process performed by a rotary pen brush.

24. In the manufacturing method for a semiconductor integrated circuit according to any one of Items 1 to 20, the wet cleaning process includes:
(d1) a first chemical solution cleaning process performed by the first rotary roll brush; and
(d3) a third rinsing process performed without a brush after the first chemical solution cleaning process.

25. In the manufacturing method for a semiconductor integrated circuit device according to any one of claims 1 to 20, the wet cleaning process further includes:
(d1) a first chemical solution cleaning process performed by a first rotary roll brush;
(d3) a third chemical solution cleaning process performed by the rotary pen brush after the first chemical solution cleaning process;
(d4) a first rinsing process performed without a brush after the third chemical solution cleaning process; and
(d6) a third rinsing process performed without a brush between the first chemical solution cleaning process and the third chemical solution cleaning process.

26. In the manufacturing method for a semiconductor integrated circuit device according to any one of claims 1 to 20, the wet cleaning process further includes:
(d1) a first chemical solution cleaning process performed by a first rotary roll brush;
(d2) a second chemical solution cleaning process performed by a second rotary roll brush after the first chemical solution cleaning process;
(d5) a second rinsing process performed without a brush after the second chemical solution cleaning process; and
(d6) a third rinsing process performed without a brush between the first chemical solution cleaning process and the second chemical solution cleaning process.

27. A manufacturing method for a semiconductor integrated circuit device includes the steps of:
(a) forming a wiring trench in a first insulating film over a first main surface of a wafer;
(b) forming a metal member layer in the wiring trench and over the first insulating film so as to fill the wiring trench therewith;
(c) forming an embedded wiring by removing the metal member layer located outside the wiring trench by a CMP process;
(d) after the step (c), applying a wet cleaning process to the first main surface side of the wafer with the embedded wiring formed therein; and
(e) after the step (d), drying the first main surface side of the wafer,
wherein the wet cleaning process further includes:
(d1) a first chemical solution cleaning process performed by a first rotary roll brush;
(d2) a second chemical solution cleaning process performed by a second rotary roll brush after the first chemical solution cleaning process;
(d3) a third chemical solution cleaning process performed by a rotary pen brush after the second chemical solution cleaning process;
(d4) a first rinsing process performed without a brush after the third chemical solution cleaning process;
(d5) a second rinsing process performed without a brush between the second chemical solution cleaning process and the third chemical solution cleaning process; and
(d6) a third rinsing process performed without a brush between the first chemical solution cleaning process and the second chemical solution cleaning process.

28. In the manufacturing method for a semiconductor integrated circuit device according to Item 27, the rotation speed of each of the first rotary roll brush and the second rotary roll brush is equal to or more than 180 times per minute, and less than 300 times per minute.

29. In the manufacturing method for a semiconductor integrated circuit device according to Item 27, the rotation speed of each of the first rotary roll brush and the second rotary roll brush is equal to or more than 160 times per minute, and less than 500 times per minute.

30. In the manufacturing method for a semiconductor integrated circuit device according to Item 27, the rotation speed of each of the first rotary roll brush and the second rotary roll brush is equal to or more than 170 times per minute, and less than 400 times per minute.

31. A manufacturing method for a semiconductor integrated circuit device includes the steps of:
(a) forming a wiring trench in a first insulating film over a first main surface of a wafer;
(b) forming a metal member layer in the wiring trench and over the first insulating film so as to fill the wiring trench therewith;
(c) forming an embedded wiring by removing the metal member layer located outside the wiring trench by a CMP process;
(d) after the step (c), applying a wet cleaning process to the first main surface side of the wafer with the embedded wiring formed therein while supplying a chemical solution or pure water thereto by a nozzle; and
(e) after the step (d), drying the first main surface side of the wafer,
wherein a shape of a section of the first main surface of the wafer against which the chemical solution or pure water supplied from the nozzle is abutted has a dimension in one axial direction which is three or more times as long as that in the other axial direction perpendicular thereto.

31. In the manufacturing method for a semiconductor integrated circuit device according to Item 30, the number of the nozzles is plural.

32. In the manufacturing method for a semiconductor integrated circuit device according to Item 31, in each of the nozzles, the shape of the section of the first main surface of the wafer against which the chemical solution or pure water is abutted has a dimension in one axial direction which is five or more times as long as that in the other axial direction perpendicular thereto.

33. In the manufacturing method for a semiconductor integrated circuit device according to Item 30 or 31, the shape of the section of the first main surface has a dimension in one axial direction which is five or more times as long as that in the other axial direction perpendicular thereto.

34. In the manufacturing method for a semiconductor integrated circuit device according to any one of Items 30 to 33, the shape of the section of the first main surface of the wafer against which the chemical solution or pure water supplied from the nozzles is abutted covers a substantially entire width of the wafer.

[Explanation of Description Format, Basic Terms, and Usage in Present Application]

1. In the present application, the description of preferred embodiments may be divided into sections for convenience, if necessary, but these embodiments are not individually separated from each other except when specified otherwise. Each embodiment indicates each component of a single example, a detailed part of another embodiment, or a modified example of a part or all of another embodiment. In principle, the description of the same part will be omitted. Each component of the embodiment is not essential except when specified otherwise, in theory, except when the number of components is limited, and except when indicated otherwise from the context.

2. Likewise, in the description of the embodiments or the like, the phrase "X made of A" about material, component, or the like does not exclude a member containing an element other than A as one of principal components, except when specified otherwise, and except when indicated from the context. For example, as to a component, the above phrase means "X containing A as a principal component" or the like. It is apparent that for example, the term "silicon member" or the like is not limited to pure silicon, and may include multicomponent alloy containing SiGe alloy or other silicon materials as a principal component, and a member containing other additives or the like. Likewise, it is also apparent that the term "silicon oxide film" include not only a film made of relatively pure undoped silicon dioxide, that is, undoped silicate glass (USG); but also a thermally-oxidized film made of fluorosilicate glass (FSG), TEOS-based silicon oxide, silicon oxicarbide (SiOC), carbon-doped silicon oxide, organosilicate glass (OSG), phosphorus silicate glass (PSG), borophosphosilicate glass (BPSG), or the like; a CVD oxide film; a coating type silicon oxide film made of spin on glass (SOG), nano-clustering silica (NSC), or the like; a silica-based Low-k insulating film (porous insulating film) made of the same member as described above having holes; and a composite film or the like containing the above-mentioned material as a principal component, with another silicon-based insulating film.

Further, in general, the term "copper wiring" mainly includes not only pure copper, but also a copper alloy containing copper as a principal component, and further includes, for example, a barrier metal film or the like as another component. The same goes for the term "aluminum wiring". Material for the aluminum wiring is normally an aluminum alloy containing aluminum as a principal component, and about several percentages or less of copper, silicon, and another additive in many cases. Further, the aluminum wiring layer is not a single film, but one with an additive film, such as a TiN film, formed on both sides thereof in many cases.

3. Likewise, it is apparent that preferred examples of diagrams, positions, properties, and the like are described in the embodiments, but the invention is not strictly limited thereto except when specified otherwise, and except when indicated otherwise from the context.

4. Further, when referring to a specific value or quantity, the invention may have a value exceeding the specific value, or may have a value less than the specific value except when specified otherwise, in theory, except when the number of components is limited thereto, and except when indicated otherwise from the context.

5. The term "wafer" generally indicates a single crystal silicon wafer over which a semiconductor integrated circuit device (note that the same goes for a semiconductor device, and an electronic device) is normally formed, but may include a composite wafer or the like of an insulating substrate, such as an epitaxial wafer or an SOI wafer, and a semiconductor layer or the like.

6. The term "CMP process" means not only a normal CMP process, but also electro-chemical mechanical polishing (ECMP) and the like.

[Further Detailed Description of the Preferred Embodiments]

The preferred embodiments will be further described below in detail. In the respective drawings, the same or similar part is designated by the same or similar reference character or numeral, and a description thereof will not be repeated in principle.

1. Explanation of Outline of Metal CMP and Post CMP Cleaning Processes in Manufacturing Method for Semiconductor Integrated Circuit Device in One Embodiment of Present Application (See Mainly FIGS. 1 to 3)

Figure 2:
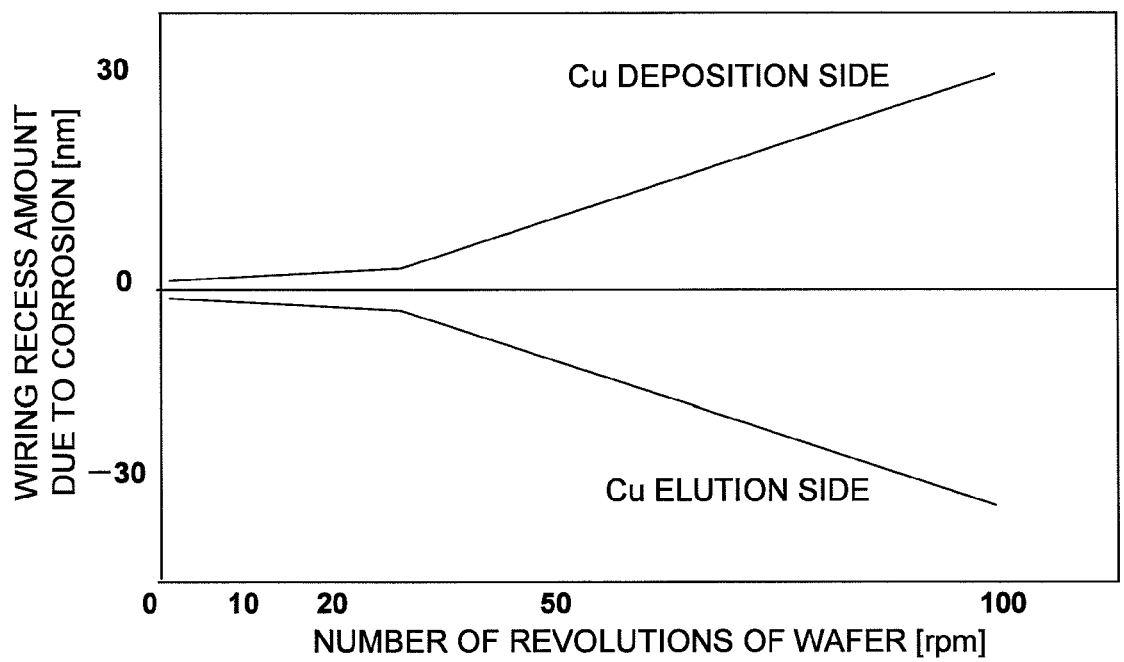
FIG. 2 is a graph showing the relationship between the rotation speed of the wafer and the corrosion of an embedded wiring caused by wet cleaning after the damascene CMP in the manufacturing method for the semiconductor integrated circuit device according to the embodiment of the present application.
Figure 3:
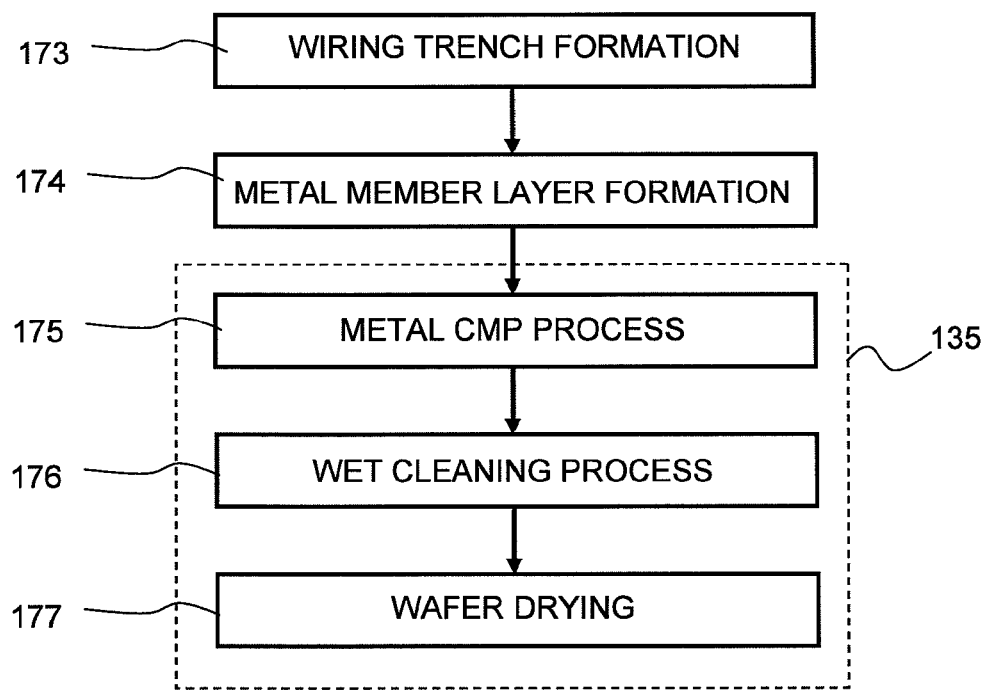
FIG. 3 is a block flow diagram showing a main process in the manufacturing method for the semiconductor integrated circuit device according to the embodiment of the present application.

FIGS. 1A, 1B, and 1C explain the principle of wet cleaning after damascene CMP in the manufacturing method for a semiconductor integrated circuit device according to one embodiment of the present application, in which FIG. 1A is a perspective view of an upper surface of a wafer, FIG. 1B is a side view of the wafer in high-speed rotation about its axis, and FIG. 1C is a side view of the wafer in low-speed rotation about its axis. FIG. 2 is a graph showing the relationship between the rotation speed of the wafer and corrosion of an embedded wiring caused by wet cleaning after the damascene CMP in the manufacturing method for the semiconductor integrated circuit device according to one embodiment of the present application. FIG. 3 is a main process block flow diagram of the manufacturing method for the semiconductor integrated circuit device in the embodiment of the present application. Referring to these drawings, the outline of the metal CMP and post CMP cleaning processes in the manufacturing method for the semiconductor integrated circuit device according to the embodiment of the present application will be described below.

As shown in FIG. 3, in a dual damascene process, which is a standard copper embedded wiring process, first, vias and wiring trenches are formed in an interlayer insulating film (wiring trench formation step S173). Thereafter, a metal member layer is formed over the entire first main surface (device surface) of the wafer in such a manner that the vias and wiring trenches are filled with wiring metal containing copper as a principal component (metal member layer formation step S174). Then, the wafer is transferred to and processed by an integrated CMP and post-cleaning device 135. In the CMP and post-cleaning device 135, first, unnecessary parts of the metal member layer are removed by the CMP process (metal CMP process step S175). Next, the wafer is subjected to a cleaning process 176 so as to remove residual slurry components and the like, and then to a spin drying process (wafer drying step S177) to be discharged outward from the CMP and post-cleaning device 135.

In the metal CMP process step S175, slurry to which BTA serving as an antiseptic agent for copper is added is used. However, the antiseptic agent forms complexes with copper, which may generate foreign matter. For this reason, powerful cleaning is required for the post cleaning. Although the powerful cleaning is performed so as not to generate foreign matter, severe corrosion of copper may be caused. Thus, only the simple powerful cleaning makes it difficult to form wiring with high reliability.

The inventors of the present application have examined causes for the corrosion, and found the following. That is, as shown in FIG. 2, the rotation speed of the wafer (speed of rotation in the main surface of the wafer about the center of the wafer) during cleaning (mainly during cleaning with a brush and then rinsing with pure water) is generally set within a range for example, of about 50 to 100 times per minute (hereinafter referred to as "high-speed rotation") so as to ensure uniform cleaning, which is a standard condition. However, when the rotation speed is shifted to a low-speed side, which is conventionally considered to be inappropriate, it is found that the corrosion of copper is gradually improved. The corrosion of copper is apparently found to be caused by a concentration-cell effect relating to nonuniform dissolved oxygen in a cleaning liquid (chemical solution or pure water) over the wafer during the cleaning step. The mechanism for causing the nonuniform dissolved oxygen will be described below.

As shown in FIG. 1A, a cleaning liquid 129 supplied to the first main surface 1a of the wafer 1 from a cleaning liquid nozzle 128 has thickness distribution 129b whose center is very thick and whose periphery is very thin (see FIG. 1B) in high-speed rotation (when the wafer 1 is rotated by a rotor 130 during cleaning). In contrast, relatively uniform thickness distribution 129c is found to be obtained in low-speed rotation (FIG. 1C). The dissolved oxygen drastically increases with decreasing thickness of the cleaning liquid. Thus, the number of revolutions of the wafer is set to a relatively low speed, that is, to a value of 30 times per minute or less (upper limit rotational speed of the wafer), which can suppress corrosion within the allowable range. In contrast, since the rotation of the wafer requires a rotation brush crossing the wafer to be in uniform contact with a wafer main surface, the wafer needs to be rotated at an angle of 180 degrees or more during a unit step (the cleaning step with a chemical solution and the rinsing step on the same stage forming the respective unit steps) in theory. When the minimum unit step time is 30 seconds, the lower limit wafer rotational speed becomes about one time per minute. Taking into consideration the unremoved material, the practical range of rotation of the wafer is from twice per minute to 22 times per minute. The most preferable range is from four times per minute to 16 times per minute.

2. Explanation of CMP Device and Series of Processes Using Device for Use in Manufacturing Method for Semiconductor Integrated Circuit Device According to One Embodiment of Present Application (See Mainly FIGS. 4 to 9)

Figure 4:
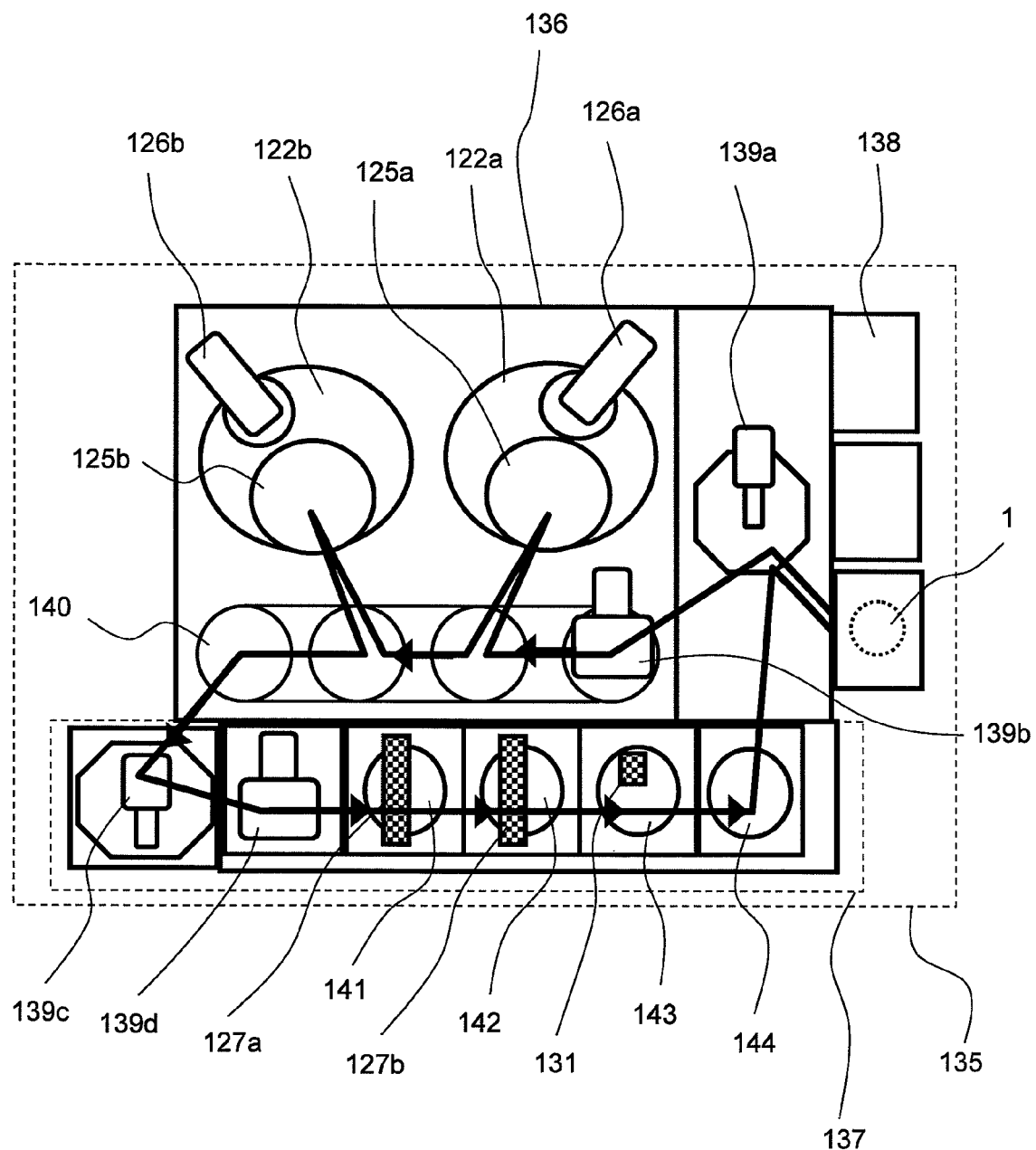
FIG. 4 is a top view of an integrated damascene CMP and post-CMP wet cleaning device used in the manufacturing method for a semiconductor integrated circuit device according to the embodiment of the present application.
Figure 5:
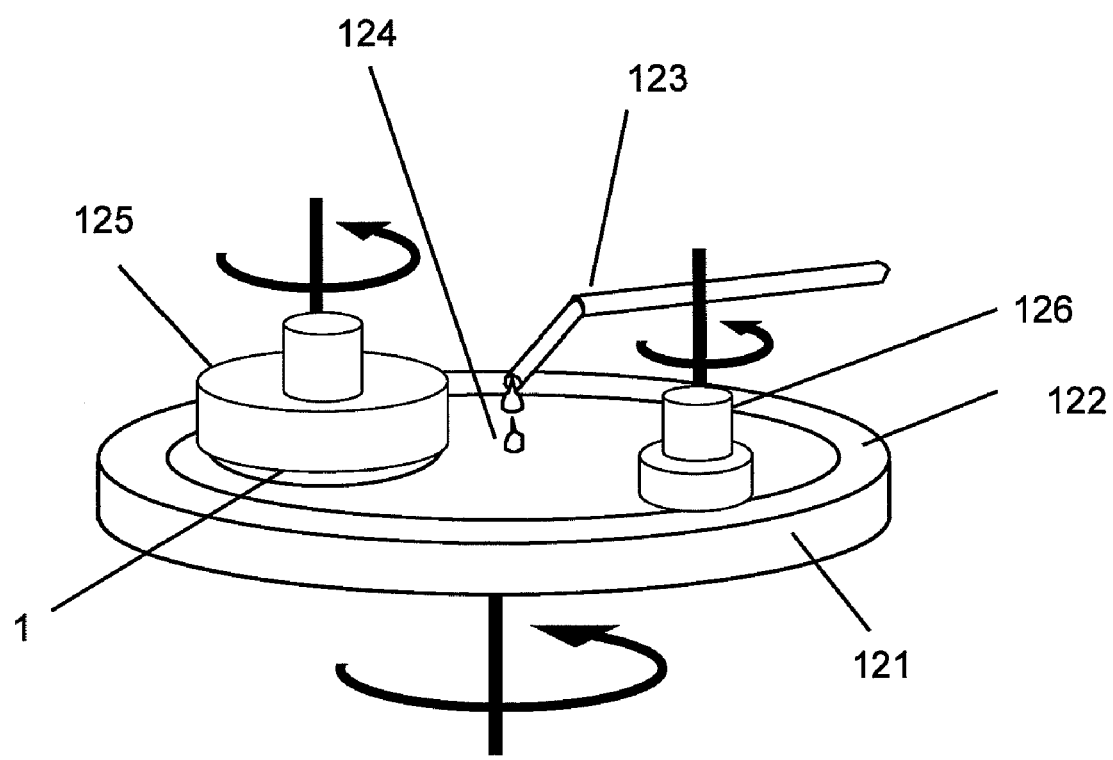
FIG. 5 is a perspective view showing the periphery of a polishing platen of a polishing portion of the integrated damascene CMP and post-CMP wet cleaning device used in the manufacturing method for a semiconductor integrated circuit device according to the embodiment of the present application.
Figure 6:
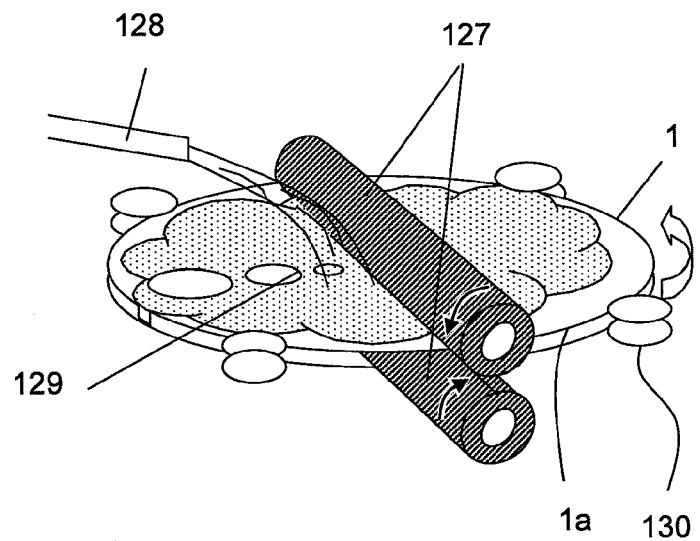
FIG. 6 is a perspective view showing a roll brush cleaning region (cleaning stage 1 or 2) of a post-CMP cleaning portion of the integrated damascene CMP and post-CMP wet cleaning device used in the manufacturing method for a semiconductor integrated circuit device according to the embodiment of the present application.
Figure 7:
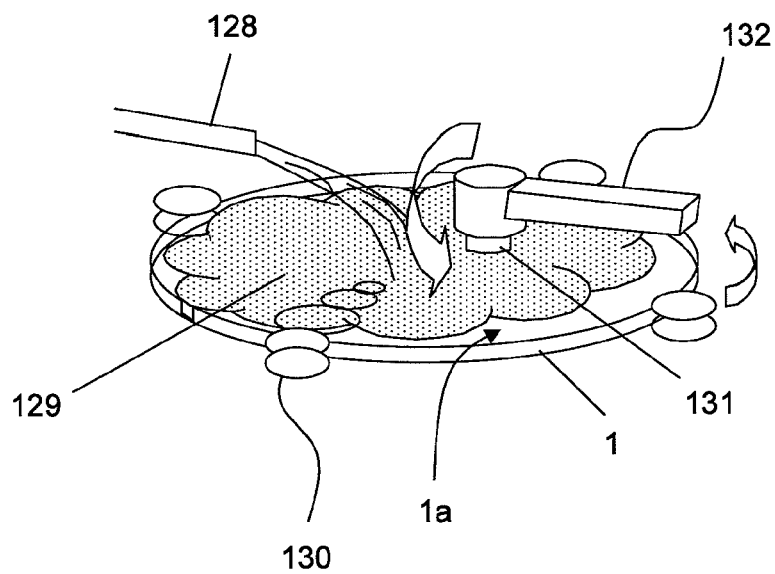
FIG. 7 is a perspective view showing a pen brush cleaning region (cleaning stage 3) of the post CMP cleaning portion of the integrated damascene CMP and post-CMP wet cleaning device used in the manufacturing method for a semiconductor integrated circuit device according to the embodiment of the present application.
Figure 8:
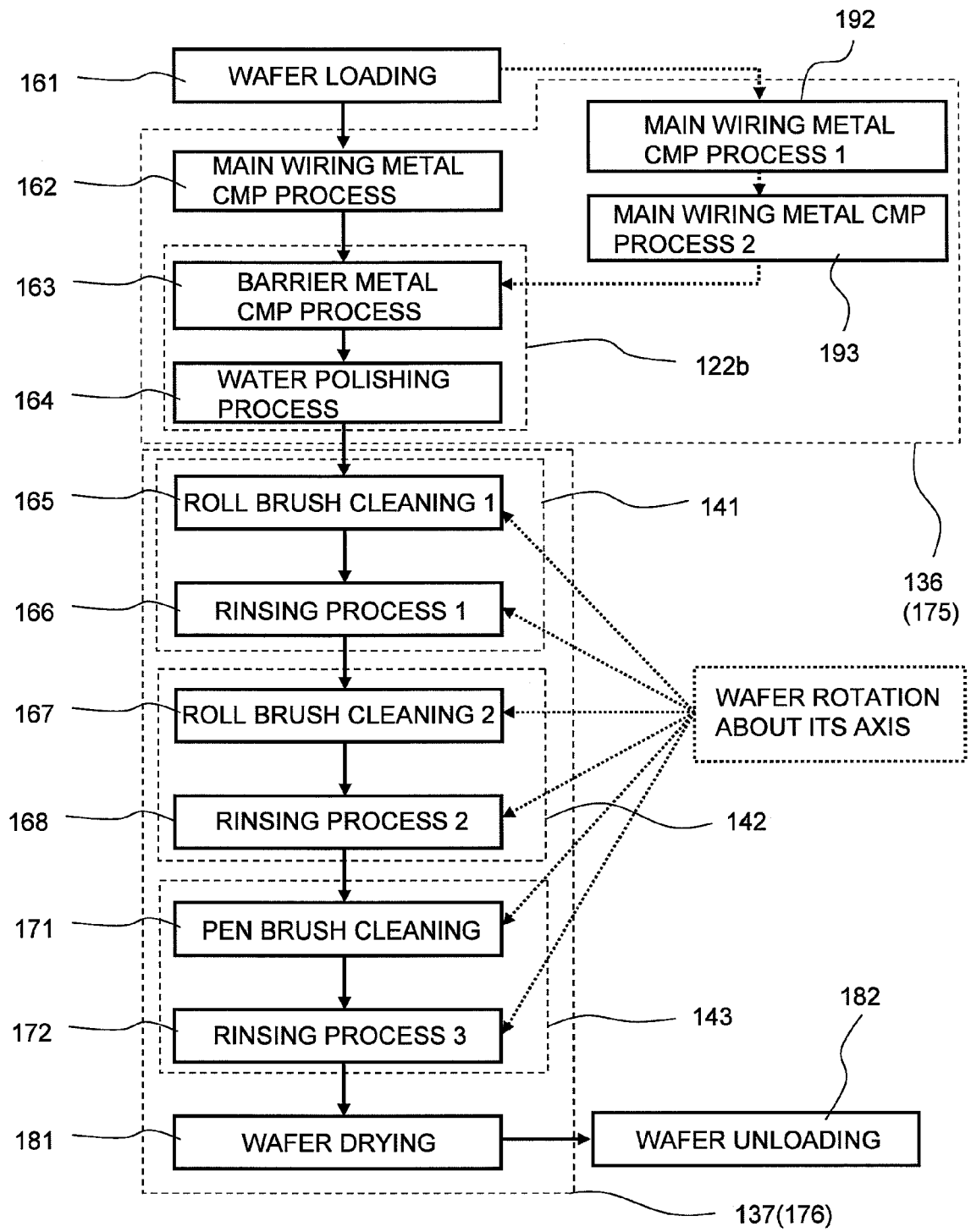
FIG. 8 is a detailed process block flow diagram showing the damascene CMP and post-CMP wet cleaning in the manufacturing method for the semiconductor integrated circuit device according to the embodiment of the present application.

FIG. 4 is a top view of an integrated damascene CMP and post-CMP wet cleaning device used in the manufacturing method for a semiconductor integrated circuit device according to the embodiment of the present application. FIG. 5 is a perspective view showing the periphery of a polishing platen of a polishing portion of integrated damascene CMP and post-CMP wet cleaning device used in the manufacturing method for a semiconductor integrated circuit device in the embodiment of the present application. FIG. 6 is a perspective view showing a roll brush cleaning region (cleaning stage 1 or 2) of a post-CMP cleaning portion of the integrated damascene CMP and post-CMP wet cleaning device used in the manufacturing method for a semiconductor integrated circuit device in the embodiment of the present application. FIG. 7 is a perspective view showing a pen brush cleaning region (cleaning stage 3) of the post CMP cleaning portion of the integrated damascene CMP and post-CMP wet cleaning device used in the manufacturing method for a semiconductor integrated circuit device in the embodiment of the present application. FIG. 8 is a detailed process block flow diagram showing the damascene CMP and post-CMP wet cleaning in the manufacturing method for the semiconductor integrated circuit device in the embodiment of the present application. FIG. 9 is a table summarizing the detailed process flow of the wet cleaning after the damascene CMP (containing processing similar to the cleaning in a part of the polishing process) in the manufacturing method for the semiconductor integrated circuit device in the embodiment of the present application. Based on these drawings, the CMP device and the series of processes using the device for use in the manufacturing method for the semiconductor integrated circuit device according to the embodiment of the present application will be described below.

Now, the outline of the flow of the wafer process in the integrated damascene CMP and post-CMP wet cleaning device 135 will be described below. As shown in FIGS. 4 and 8, first, a wafer transport container 138 for accommodating therein wafers 1 to be processed, that is, a front opening unified rod (Foup) is set on a load port (normally, twelve wafers of 300 φ region being accommodated). Thereafter, each wafer 1 is first set on a polishing pad 122a on a platen for copper CMP by a robot 139a for loading and unloading via a wafer robot 139b of a waiting portion 140 of a CMP processor 136 (wafer loading step 161 shown in FIG. 8). The wafer is subjected to the copper CMP process 162 by a rotation polishing head 125a for copper CMP. Then, the wafer is again set on a polishing pad 122b on the platen for the barrier metal CMP via the wafer robot 139b of the waiting portion 140, and is subjected to barrier metal CMP process 163 by a rotating polishing head 125b for the barrier metal CMP. Polishing slurry containing an anticorrosive agent, such as BTA, is used in the barrier metal CMP process 163. The anticorrosive agent for copper may be any other anticorrosive agent that forms a complex with copper.

After finishing, the wafer is subjected to a water polishing process 164 for a relatively short time as it is (note that the water polishing is not essential, but can improve the cleaning effect by a relatively simple operation). In the description above, the metal CMP step 175 (see FIG. 8) has been explained. In the following, a post-cleaning step 176 will be described. As shown in FIG. 8, in a device including three platens, the metal CMP process for a main wiring may be divided into a copper rough CMP process 192 and a copper complete removing process 193 using two platens.

Thereafter, as shown in FIG. 4, the wafer 1 to be processed is transported to a post-cleaning portion 137 by a wafer robot 139b of the waiting portion 140 and a wafer robot 139c for delivery and receipt of the post-cleaning portion 137. Thereafter, the wafer 1 to be processed is loaded on a primary cleaning stage 141 (primary cleaning section) by a robot 139d for loading the wafer. The wafer 1 is subjected to primary roll brush cleaning 165 by the primary roll brush 127a (which rotates about its axis in contact with the main surface of the wafer), while being supplied with a chemical solution, such as an acidic cleaning solution containing, for example, organic acid and an amine based component (for example, having a pH for example, of about 3.3 at 25 degrees C.). Subsequently, the supply of the chemical solution is stopped and pure water is supplied, while the roll brush 127a is spaced apart from the wafer 1 (note that other conditions are the same) thereby to perform a primary rinsing process 166. At this time, the chemical solution may be an alkaline cleaning solution.

Then, the wafer 1 to be processed is transported to a secondary cleaning stage 142 (secondary cleaning section). The wafer 1 is subjected to secondary roll brush cleaning 167 by a secondary roll brush 127b (which rotates about its axis in contact with the main surface of the wafer), while being supplied with, for example, the above-mentioned acidic cleaning solution (which may be a different one from the above). Subsequently, the supply of the chemical solution is stopped and pure water is supplied, while the roll brush 127a is spaced apart from the wafer 1 (note that other conditions are the same) thereby to perform a secondary rinsing process 168. The rotation speed of the roll brush in each of the primary and secondary roll brush cleaning processes may be preferably equal to or more than 160 times per minute, and less than 500 times per minute. In order to sufficiently enhance the cleaning effect, the rotation speed of the roll brush may be more preferably equal to or more than 170 times per minute, and less than 400 times per minute, and most preferably equal to or more than 180 times per minute, and less than 300 times per minute.

Then, the wafer 1 to be processed is transported to a tertiary cleaning stage 143 (tertiary cleaning section). The wafer 1 is subjected to a pen brush cleaning 171 by a pen brush 131 (which rotates about its axis in contact with the main surface of the wafer), while being supplied with, for example, an acidic cleaning solution (which may be a different one). Subsequently, the supply of the chemical solution is stopped and pure water is supplied, while the pen brush 131 is spaced apart from the wafer 1 (note that other conditions are the same) thereby to perform a tertiary rinsing process 172.

Then, the wafer 1 to be processed is vacuum-sucked onto a wafer drying stage 144, and subjected to a drying process 181 by being rotated at high speed. Thereafter, the wafer 1 to be processed is normally returned to the original foup 138 by the robot 139a for loading and unloading (wafer unloading step 182 in FIG. 8).

Now, the details of respective components of the CMP device explained above will be described below based on FIGS. 5 to 7. Both CMP stages shown in FIG. 4 have the structure shown in FIG. 5. A polishing pad 122 is stretched on a rotational platen 121. The wafer 1 is held by the lower surface of the rotating polishing head 125. Slurry 124 or the like is supplied from a polishing solution supply nozzle 123. A pad dresser 126 rotates on the polishing pad 122.

Then, each of the primary and secondary cleaning stages 141 and 142 shown in FIG. 4 (in cleaning with the chemical solution) has the structure shown in FIG. 6. On the front and back main surfaces of the wafer 1, a pair of sponge-like cylindrical brushes 127 made of, for example, poly-vinyl-alcohol (PVA) (which may be made of any other resin) rotates at high speed with its side surface in contact with the wafer 1 to cross the wafer. In rinsing, the brushes 127 are opened to be removed from the front and back main surfaces of the wafer 1.

Next, a tertiary cleaning stage 143 shown in FIG. 4 (in cleaning with the chemical solution) has the arrangement shown in FIG. 7. On the front main surface of the wafer 1, a cylindrical pen brush 131 made of, for example, sponge-like PVA (which may be made of any other resin) rotates at high speed with its bottom surface being in contact with the wafer. In rinsing, the pen brush 131 is raised to be spaced apart from the front main surface of the wafer 1. The pen brush 131 is moved by a swing arm so as to cross the wafer, for example, from the center of the wafer to the periphery thereof at one time, during cleaning with the chemical solution.

Now, an example of detailed conditions of the post-cleaning step 176 shown in FIG. 4 will be described based on FIG. 9. The first feature of the process is that the rotation of the wafer about its axis is relatively small, for example, 10 times per minute, in cleaning (in chemical solution and pure water cleaning steps other than the pen brush cleaning with the chemical solution) (note that in a standard process presently used widely, the rotation speed of the wafer is set from 50 times per minute to 100 times per minute). The second feature is that the rotation speed of the brush is set slightly high, for example, to 200 times per minute (note that in a standard process presently used widely, the brush rotation speed is set to about 150 times per minute). Such setting may prevent the corrosion, whereby the cleaning effect is enhanced by increasing the rotation speed up to the uppermost limit one for the device. Finally, the third feature is that the pen brush cleaning is added. This has an effect of further increasing the removal performance of foreign matter. The reason why the rotation speed of the wafer in the pen brush cleaning with the chemical solution is high is that unless the rotation speed is high, the pen brush does not cover the entire wafer. That is, the reason is that relatively little oxygen is involved in the pen brush cleaning with the chemical solution, unlike the rotary brush cleaning with the chemical solution.

3. Explanation of Device Structure of Semiconductor Integrated Circuit Device in Manufacturing Method for Semiconductor Integrated Circuit Device in One Embodiment of Present Application (See Mainly FIG. 10)

Figure 10:
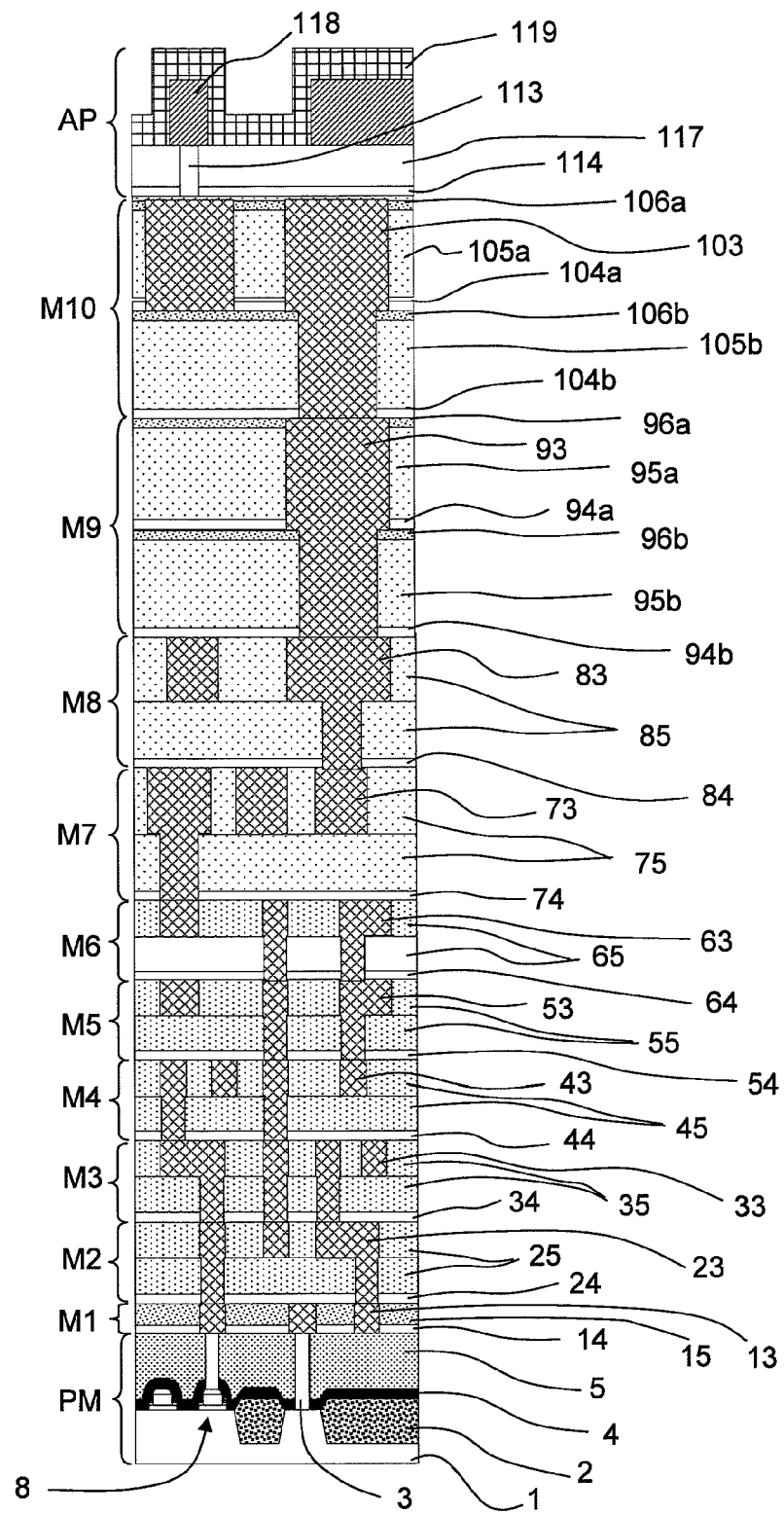
FIG. 10 is a sectional view showing a device structure of the semiconductor integrated circuit device in the manufacturing method for the semiconductor integrated circuit device according to the embodiment of the present application.

FIG. 10 is a sectional view showing the device structure of the semiconductor integrated circuit device in the manufacturing method for the semiconductor integrated circuit device according to the embodiment of the present application. The outline of the device structure of the semiconductor integrated circuit device in the manufacturing method for the semiconductor integrated circuit device according to the embodiment of the present application will be described below based on FIG. 10.

As shown in FIG. 10, a gate electrode 8 for a p-channel MOSFET or an n-channel MOSFET is formed over a device surface of a p-type single crystal silicon substrate 1 isolated by an element isolation field insulating film 2 of a shallow trench isolation type (STI). A silicon nitride liner film 4 (for example, of about 30 nm in thickness) is formed over the above-mentioned elements. A premetal interlayer insulating film made of a P-TEOS silicon oxide film (for example, of about 500 nm in thickness) by a plasma CVD method as a lower layer and a cap P-TEOS silicon oxide film (for example, of about 50 nm in thickness) as an upper layer is formed over the film 4 in a thickness further larger than that of the silicon nitride liner film 4. Tungsten plugs 3 are formed through the premetal insulating film. A region including the above-mentioned elements is a premetal region PM.

A first wiring layer M1 on the premetal region includes an insulating barrier layer 14 made of a SiCN film or the like (for example, of about 50 nm in thickness) serving as a lower layer, a plasma silicon oxide film 13 or the like (for example, of about 150 nm) serving as a main interlayer insulating film, and copper wirings 13 or the like embedded in trenches for wiring formed therein.

The respective second to sixth wiring layers M2, M3, M4, M5, and M6 formed on the layer M1 have substantially the same structure to each other. Each layer includes a composite insulating barrier film (liner film) 24, 34, 44, 54, 64, which is made of a SiCO film (for example, of about 30 nm in thickness)/SiCN film (for example, of about 30 nm in thickness) or the like serving as a lower layer, and a main interlayer insulating film 25, 35, 45, 55, 65 occupying most of the upper layer. Each main interlayer insulating film 25, 35, 45, 55, 65 includes a carbon dope oxidation silicon oxide film, that is, an SiOC film (for example, of about 350 nm in thickness), and a plasma TEOS silicon oxide film (for example, of about 80 nm in thickness) or the like serving as a cap film, which films are arranged in that order from the lower layer. Copper embedded wirings 23, 33, 43, 53, and 63 including copper plugs and copper wirings are formed through the interlayer insulating films.

The respective eighth and seventh wiring layers M7 and M8 formed on the layer M6 have substantially the same structure to each other. Each layer includes an insulating barrier film 74, 84 made of a SiCO film or the like (for example, of about 70 nm in thickness) serving as a lower layer, and a main interlayer insulating film 75, 85 or the like serving as an upper layer. Each of the main interlayer insulating films 75 and 85 includes a plasma TEOS silicon oxide film (for example, of about 250 nm in thickness), a FSG film (for example, of about 300 nm in thickness), and an USG film or the like (for example, of about 200 nm in thickness) serving as a cap film, which films are arranged in that order from the lower layer. Copper embedded wirings 73 and 83 including copper plugs and copper wirings are formed through the interlayer insulating films.

The respective ninth and tenth wiring layers M9 and M10 formed on the layer M8 have substantially the same structure to each other. Each layer is divided into an interlayer part serving as a lower layer and an in-layer part serving as an upper layer. The interlayer insulating film includes an insulating barrier film 94*b*, 104*b* made of a SiCN film or the like (for example, of about 70 nm in thickness) serving as a lower layer, and a main interlayer insulating film serving as an upper layer or the like. The main interlayer insulating film includes a FSG film 95*b*, 105*b* (for example, of about 800 nm in thickness) serving as a lower layer, and an USG film 96*b*, 106*b* or the like (for example, of about 100 nm in thickness) serving as a cap film as an upper layer. The in-layer insulating film includes an insulating barrier film 94*a*, 104*a* made of the SiCN film or the like (for example, of about 50 nm in thickness) serving as a lower layer, and a main interlayer insulating film or the like serving as an upper layer. The main in-layer insulating film includes a FSG film 95*a*, 105*a* (for example, of about 1200 nm in thickness) serving as a lower layer, and an USG film 96*a*, 106*a* (for example, of about 100 nm) serving as a cap film as an upper layer. Copper embedded wirings 93 and 103 including copper plugs and copper wirings are formed through the interlayer insulating film, the in-layer insulating film, and the like.

An uppermost wiring layer AP on the layer M10 includes an insulating barrier film made of a SiCN film 114 or the like (for example, of about 100 nm in thickness) serving as a lower layer, a main interlayer insulating film made of an intermediate USG film 117 or the like (for example, of about 900 nm in thickness), and a final passivation film or the like made of a plasma SiN 119 or the like located in the outmost position (for example, of about 600 nm). A tungsten plug 113 is provided through the interlayer insulating films, and an aluminum wiring 119 (for example, of about 1000 nm in thickness) and a bonding pad are provided on the USG film 117.

4. Explanation of Flow of Device Section in Manufacturing Method for Semiconductor Integrated Circuit Device According to One Embodiment of Present Application (See Mainly FIGS. 11 to 19)

Figure 11:
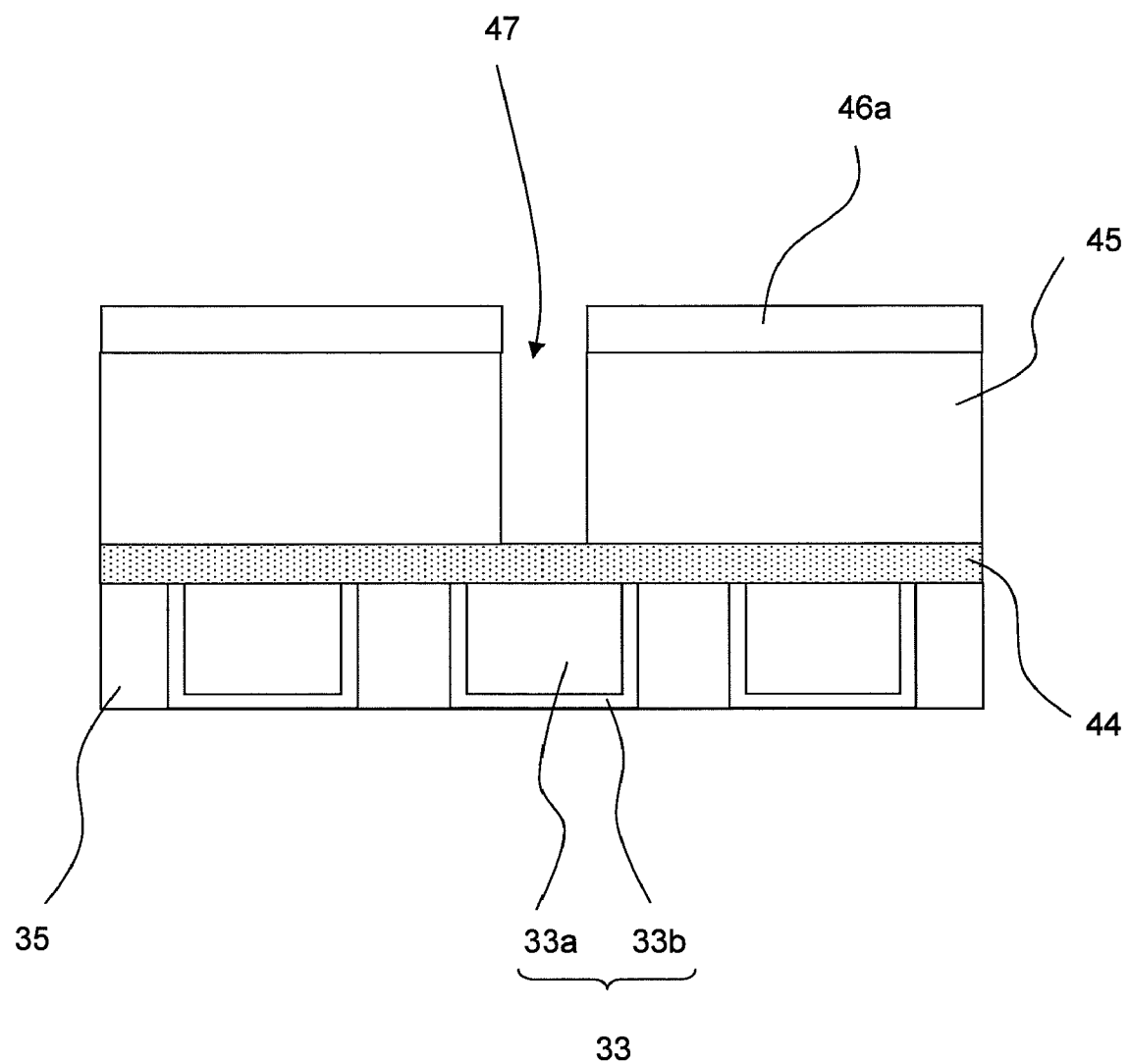
FIG. 11 is a flow diagram showing a device section (via opening step) of a damascene interconnect process in the manufacturing method for the semiconductor integrated circuit device according to the embodiment of the present application.
Figure 12:
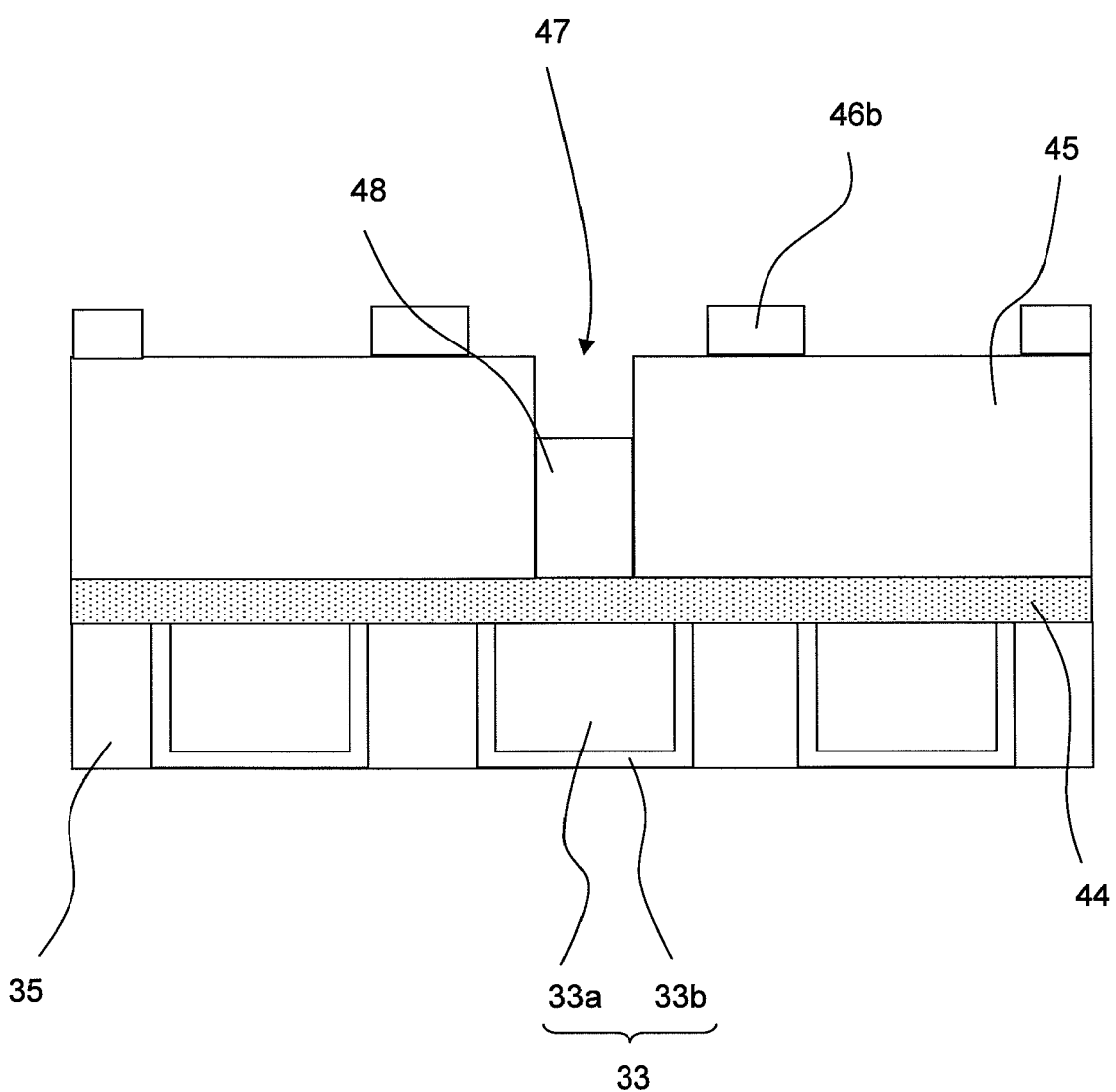
FIG. 12 is a flow diagram showing a device section (resist plug formation step) of the damascene interconnect process in the manufacturing method for the semiconductor integrated circuit device according to the embodiment of the present application.
Figure 13:
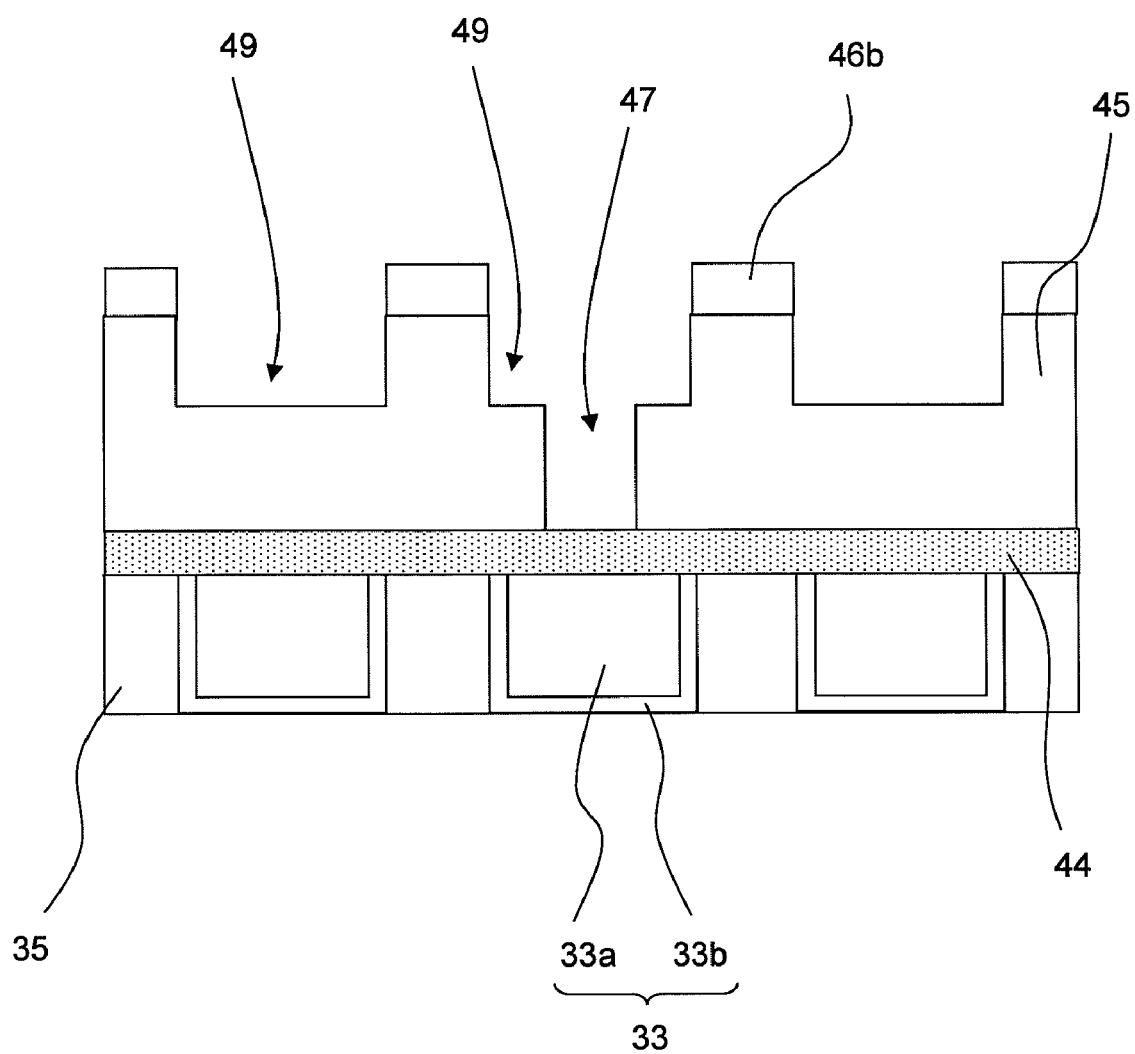
FIG. 13 is a flow diagram showing a device section (wiring trench opening step) of the damascene interconnect process in the manufacturing method for the semiconductor integrated circuit device according to the embodiment of the present application.
Figure 14:
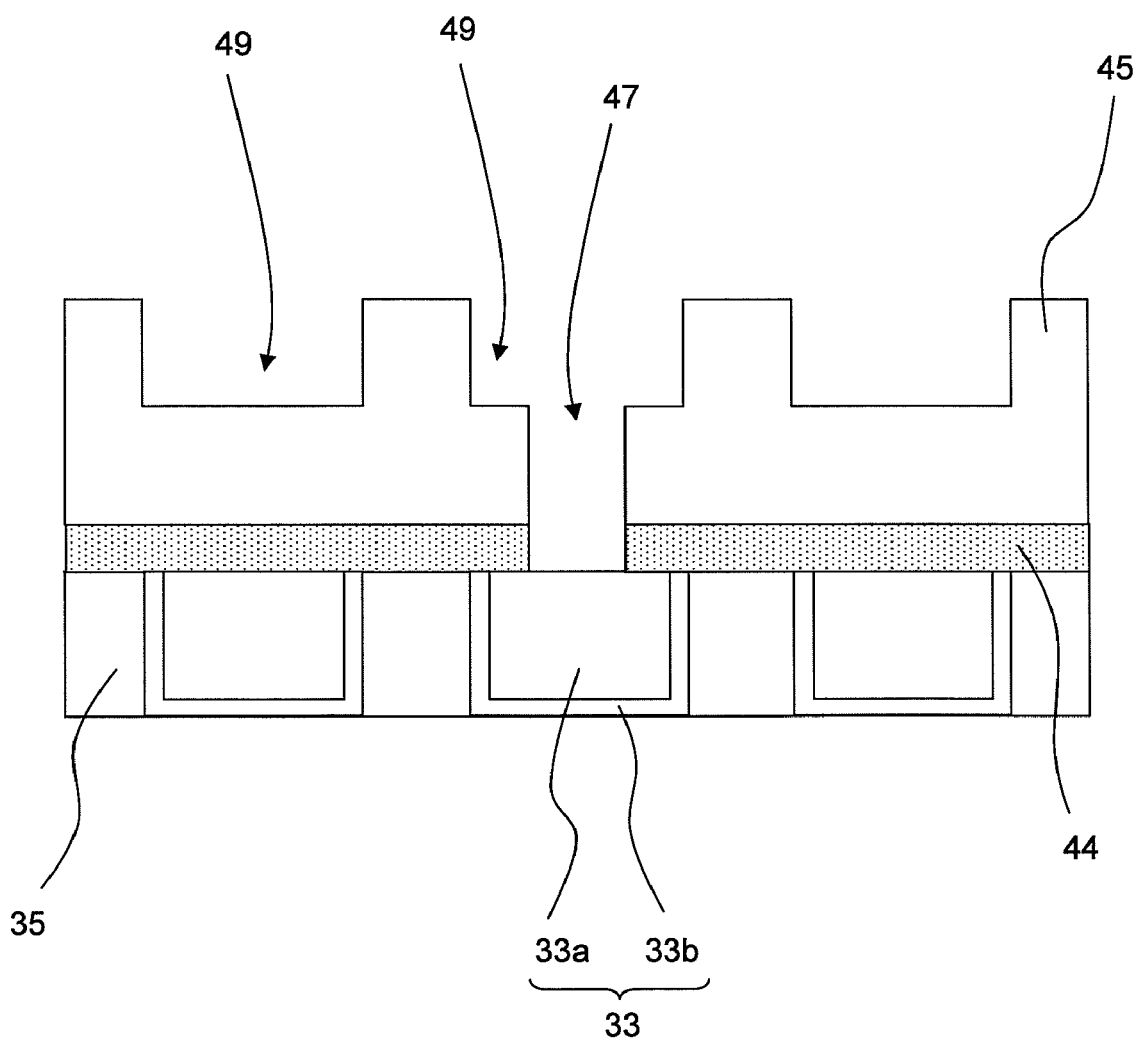
FIG. 14 is a flow diagram showing a device section (liner removing step) of the damascene interconnect process in the manufacturing method for the semiconductor integrated circuit device according to the embodiment of the present application.
Figure 15:
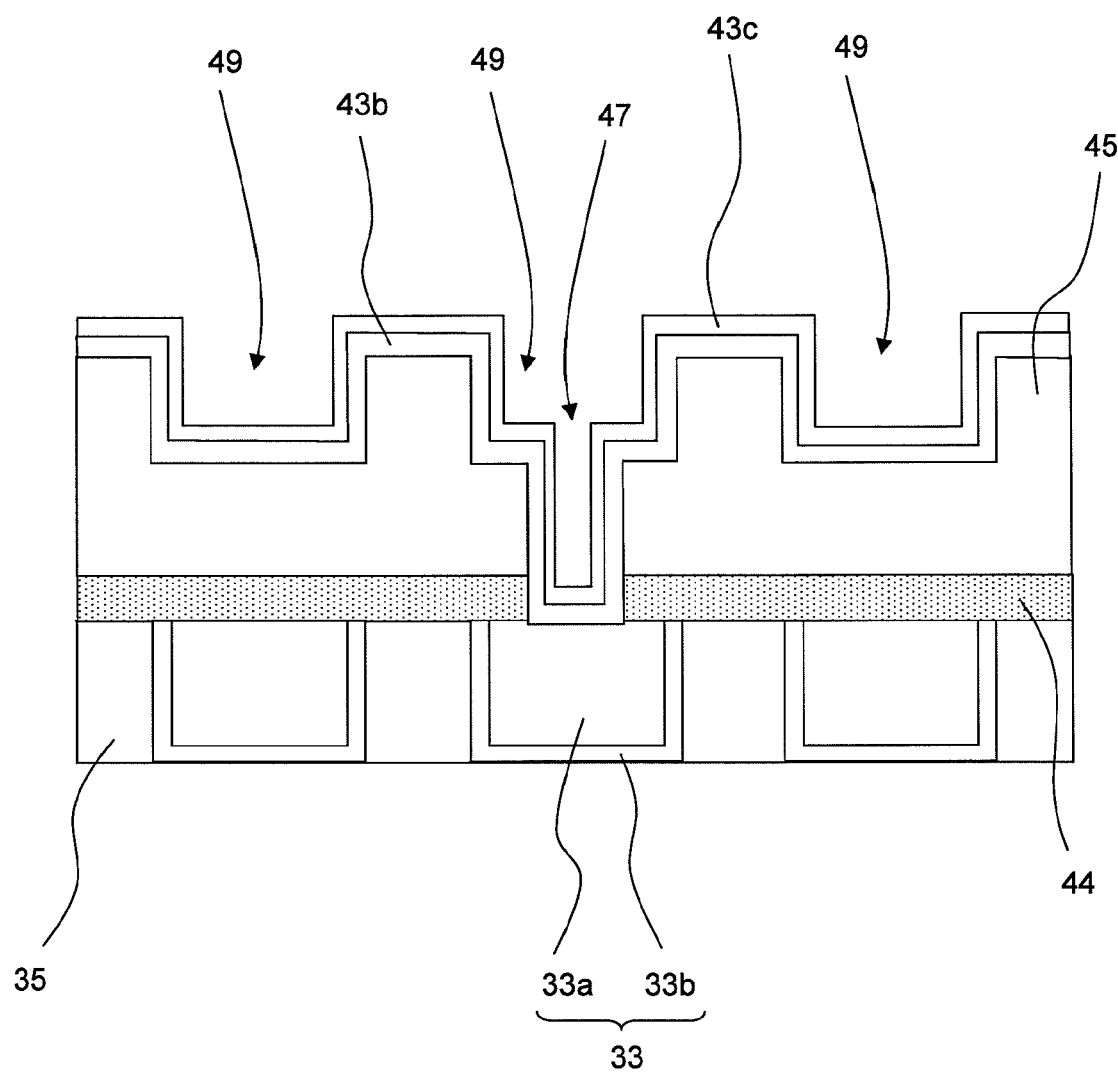
FIG. 15 is a flow diagram showing a device section (barrier metal and copper seed formation step) of the damascene interconnect process in the manufacturing method for the semiconductor integrated circuit device according to the embodiment of the present application.
Figure 16:
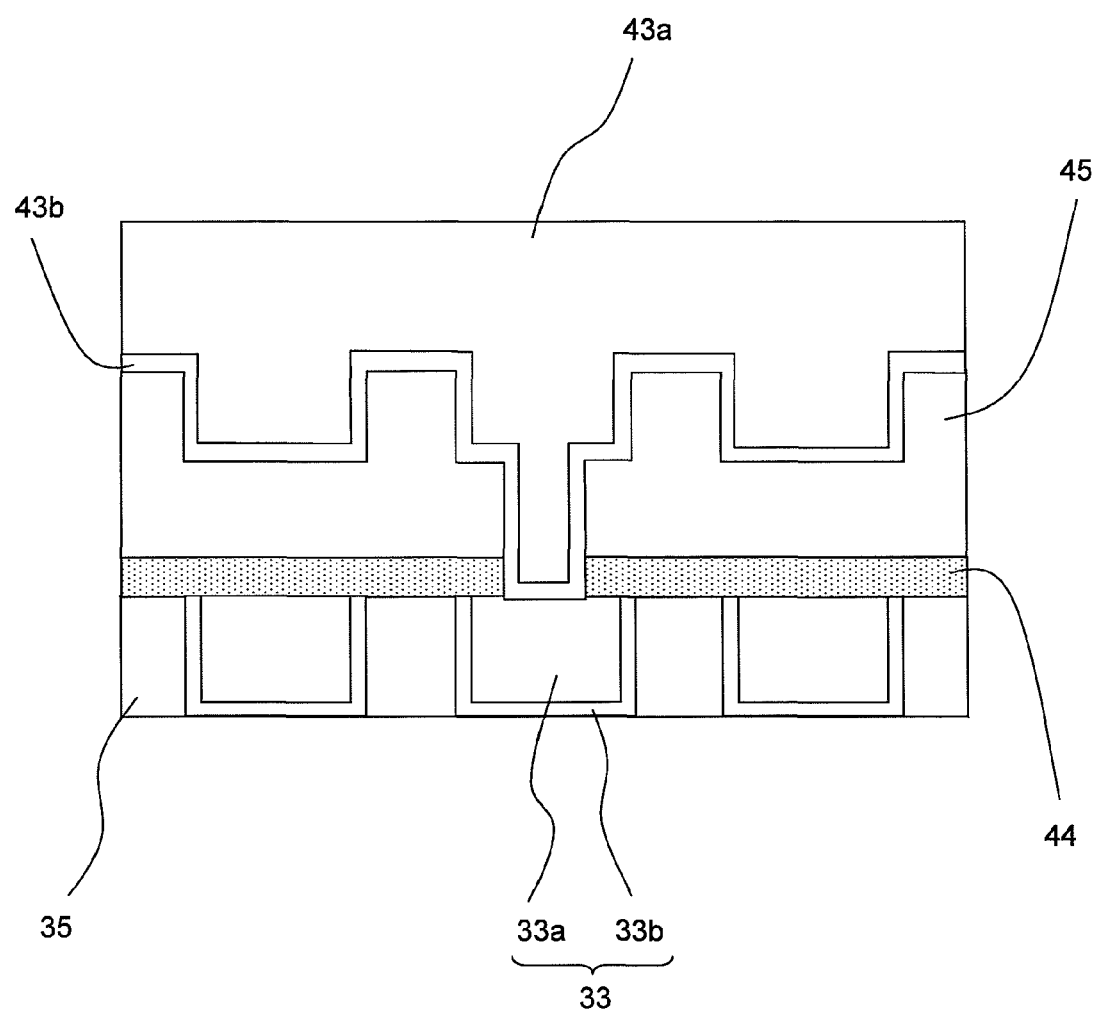
FIG. 16 is a flow diagram showing a device section (copper seed embedding step) of the damascene interconnect process in the manufacturing method for the semiconductor integrated circuit device according to the embodiment of the present application.
Figure 17:
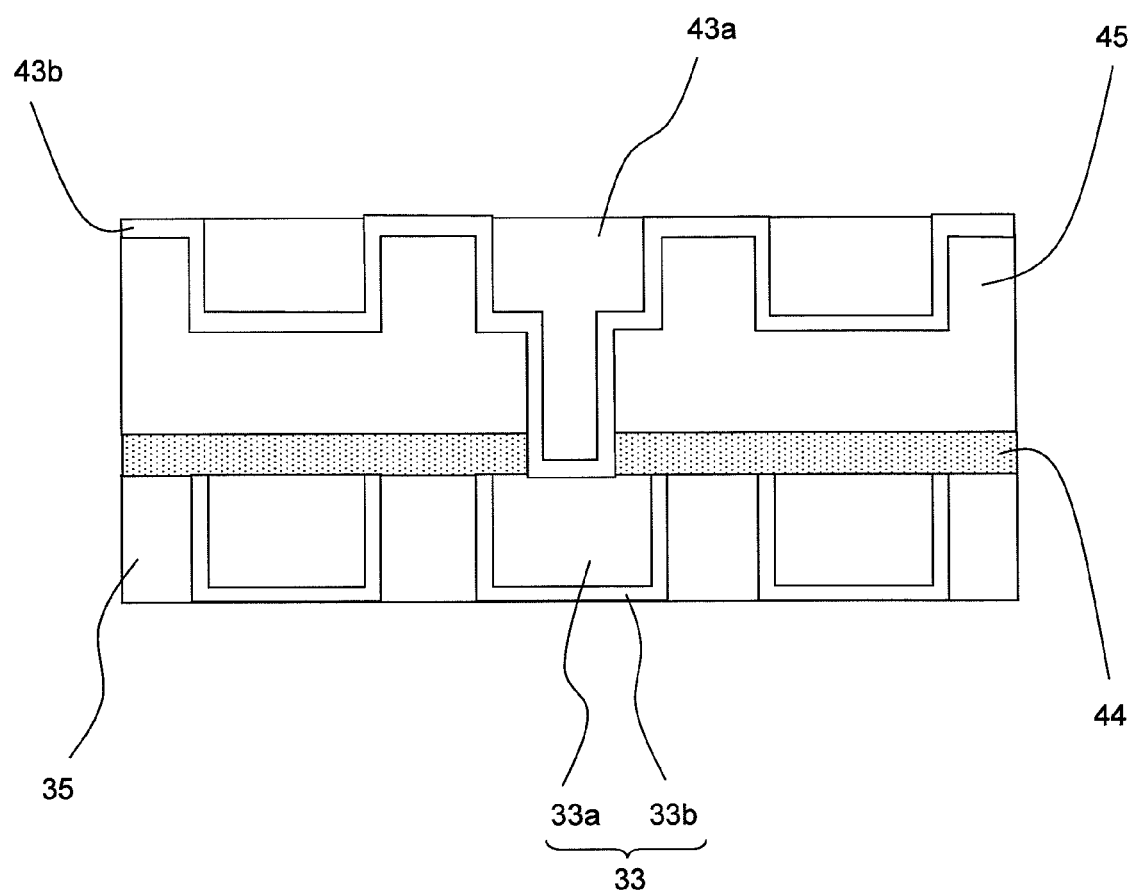
FIG. 17 is a flow diagram showing a device section (copper CMP step) of the damascene interconnect process in the manufacturing method for the semiconductor integrated circuit device according to the embodiment of the present application.
Figure 18:
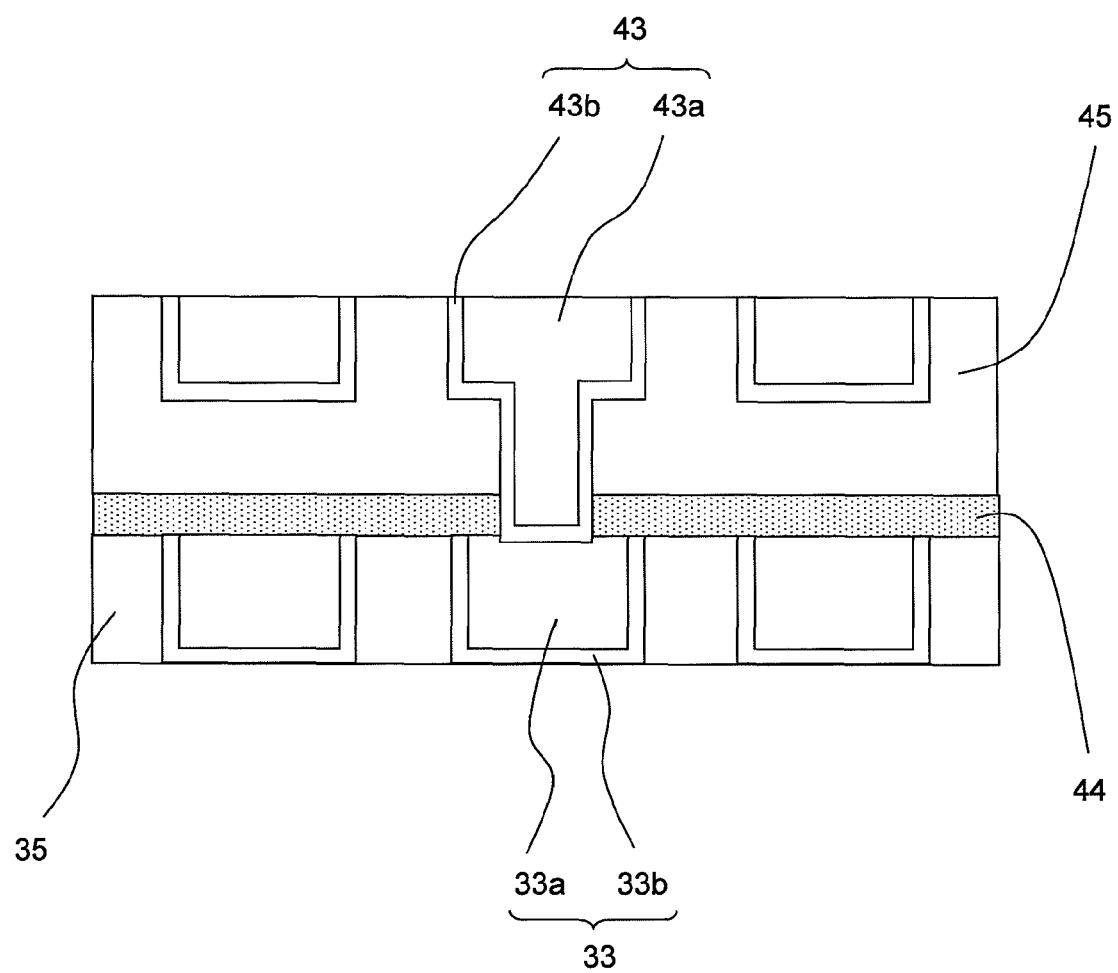
FIG. 18 is a flow diagram showing a device section (barrier metal CMP step) of the damascene interconnect process in the manufacturing method for the semiconductor integrated circuit device according to the embodiment of the present application.
Figure 19:
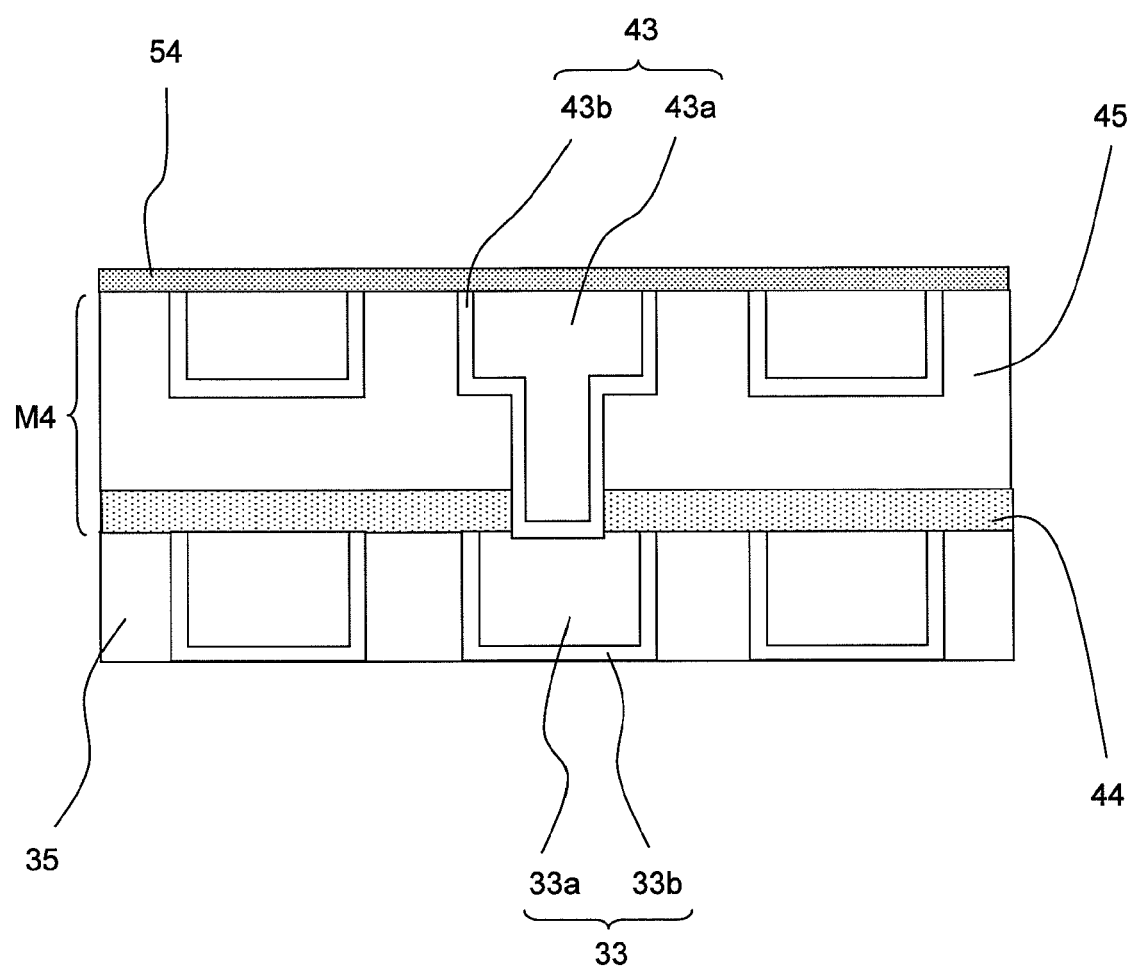
FIG. 19 is a flow diagram showing a device section (upper-layer insulating barrier film formation step) of the damascene interconnect process in the manufacturing method for the semiconductor integrated circuit device according to the embodiment of the present application.

FIG. 11 is a flow diagram showing a device section (via opening step) of a damascene interconnect process in the manufacturing method for the semiconductor integrated circuit device according to the embodiment of the present application. FIG. 12 is a flow diagram showing a device section (resist plug formation step) of the damascene interconnect process in the manufacturing method for the semiconductor integrated circuit device according to the embodiment of the present application. FIG. 13 is a flow diagram showing a device section (wiring trench opening step) of the damascene interconnect process in the manufacturing method for the semiconductor integrated circuit device according to the embodiment of the present application. FIG. 14 is a flow diagram showing a device section (liner removing step) of the damascene interconnect process in the manufacturing method for the semiconductor integrated circuit device according to the embodiment of the present application. FIG. 15 is a flow diagram showing a device section (barrier metal and copper seed formation step) of the damascene interconnect process in the manufacturing method for the semiconductor integrated circuit device according to the embodiment of the present application. FIG. 16 is a flow diagram showing a device section (copper seed embedding step) of the damascene interconnect process in the manufacturing method for the semiconductor integrated circuit device according to the embodiment of the present application. FIG. 17 is a flow diagram showing a device section (copper CMP step) of the damascene interconnect process in the manufacturing method for the semiconductor integrated circuit device according to the embodiment of the present application. FIG. 18 is a flow diagram showing a device section (barrier metal CMP step) of the damascene interconnect process in the manufacturing method for the semiconductor integrated circuit device according to the embodiment of the present application. FIG. 19 is a flow diagram showing a device section (upper-layer insulating barrier film formation step) of the damascene interconnect process in the manufacturing method for the semiconductor integrated circuit device according to the embodiment of the present application. The flow of the device section in the manufacturing method for the semiconductor integrated circuit device in the embodiment of the present application will be specifically described below based on the above-mentioned accompanying drawings by taking the M4 region (see FIG. 10) as one example.

As shown in FIG. 11, a liner film 44 is formed by a plasma CVD method or the like over a copper embedded wiring 33 containing an interlayer insulating film 35, a copper wiring 33*a*, and a barrier metal film 33*b* which are embedded therein. The barrier metal film in use is made of a composite film including a TaN layer, a Ta layer, and the like in that order from a lower layer side, but may be made of a composite film including a Ti layer, a TiN layer, and the like in that order from a lower layer side. Alternatively, the barrier metal film may be a single layered Ru film.

Further, a main interlayer insulating film 45 is formed by the plasma CVD method or the like over the liner film 44. A photoresist film pattern 46*a* (via mask) is formed on the main interlayer insulating film 45 by the normal photolithography or the like. A via 47 is opened by dry etching in a gas-phase atmosphere containing, for example, a fluorocarbon-based etching gas, using the photoresist film pattern 46*a* as a mask. Thereafter, the photoresist film pattern 46*a* is removed.

Then, as shown in FIG. 12, a coating type via-fill material 48, such as a bottom anti-reflection coating (BARC), is applied to a main surface 1*a* of the wafer 1 (onto the interlayer insulating film 45), and etching back is performed over the entire surface. Subsequently, a photoresist film pattern 46*b* (trench mask) is formed on the main interlayer insulating film 45 by the normal photolithography or the like. Then, as shown in FIG. 13, trenches 49 (wiring trenches) are opened, and the via-fill material 48 is removed by dry etching in the gas-phase atmosphere containing, for example, fluorocarbon-based etching gas, using the photoresist film pattern 46*b* as the mask.

Then, as shown in FIG. 14, the liner film 44 at the bottom of the bear 47 is removed by dry etching in the gas-phase atmosphere containing, for example, fluorocarbon-based etching gas. Thereafter, unnecessary parts of the photoresist film pattern 46*b* are removed.

Then, as shown in FIG. 15, a barrier metal film 43b and a copper seed film 43c are formed in turn in the vias 47 and the trenches 49 by sputtering or the like (which may be substituted by the CVD method). Subsequently, a copper film 43a is formed substantially over the entire main surface 1a of the wafer 1 by electroplating or the like. A metal member layer 43 (see FIG. 18) of the embedded copper wiring is formed by the copper film 43a, the barrier metal film 43b, and the copper seed film 43c.

Then, as shown in FIG. 17, the copper films 43a and 43c located outside the vias 47 and the trenches 49 are removed by a copper CMP process. Further, as shown in FIG. 18, the barrier metal films 43b located outside the vias 47 and the trenches 49 are removed by a barrier metal CMP process. Thereafter, the wafer is subjected to post CMP cleaning, and dried to be transported to the step of formation of the next wiring layer M5. As shown in FIG. 19, the fifth wiring layer M5 is formed by a process which involves first forming the liner film 54 by the CVD method.

5. Explanation of Cleaning Water Nozzle and Modified Example Thereof Used in Post-CMP Cleaning in Manufacturing Method for Semiconductor Integrated Circuit Device in One Embodiment of Present Application (See Mainly FIGS. 20A, 20B, 21A, 21B, 1A to 1C, 6, and 7)

Figure 20A:
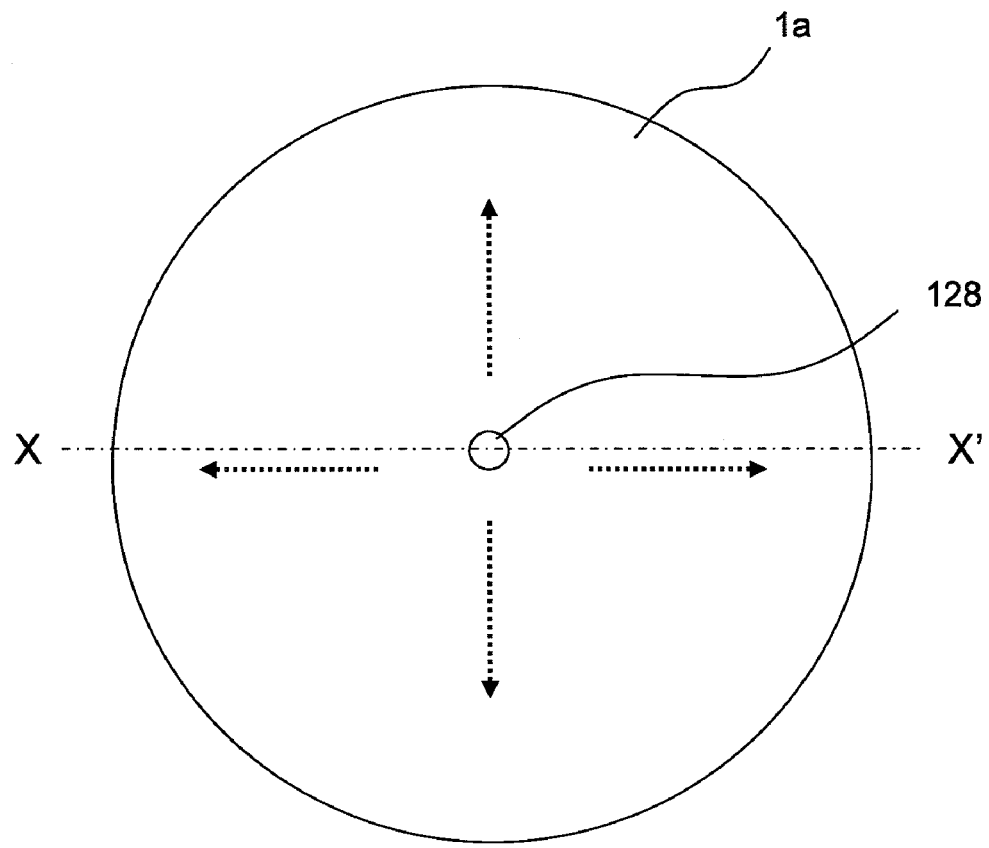
Figure 20B:
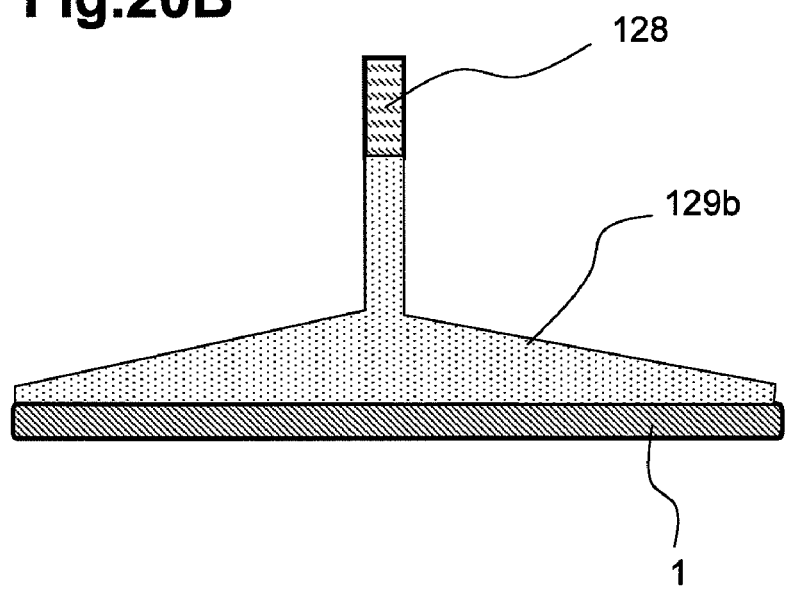
Figure 21A:
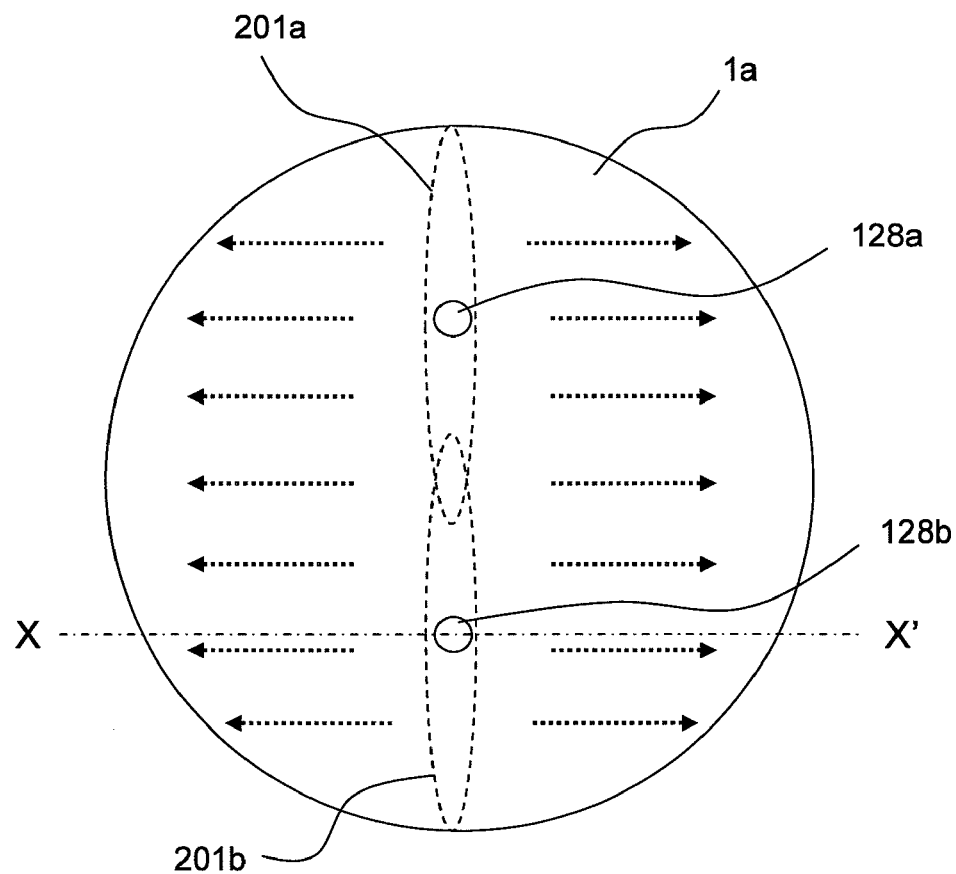
Figure 21B:
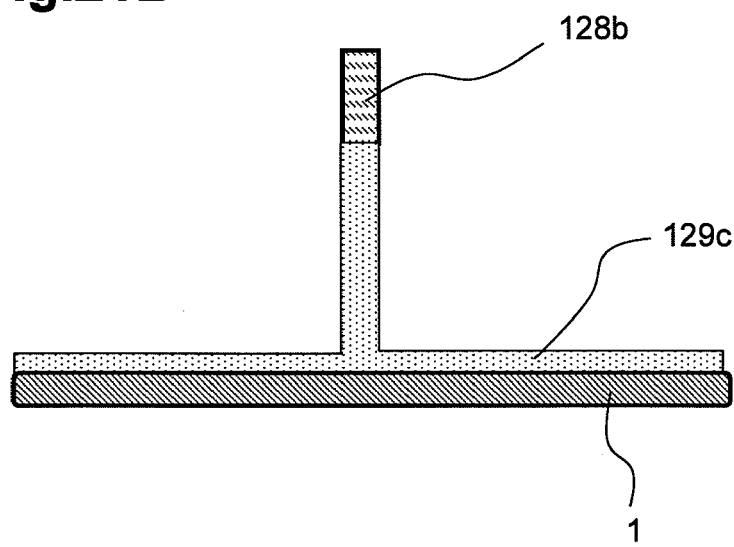

FIGS. 20A and 20B explain the effect (first example) of the chemical solution or pure water nozzle used in wet cleaning (roll brush cleaning, rinsing, pen brush cleaning, and the like) after the CMP in the manufacturing method for the semiconductor integrated circuit device according to the embodiment of the present application, in which FIG. 20A is a top view of the wafer and FIG. 20B is a schematic sectional view of the wafer taken along the line X-X' of FIG. 20A. FIGS. 21A and 21B explain the effect (second example) of the chemical solution or pure water nozzle used in wet cleaning (roll brush cleaning, rinsing, pen brush cleaning, and the like) after the CMP in the manufacturing method for the semiconductor integrated circuit device according to the embodiment of the present application, in which FIG. 21A is a top view of the wafer and FIG. 21B is a schematic sectional view of the wafer taken along the line X-X'. Now, the cleaning water nozzle and a modified example thereof used in the post-CMP cleaning in the manufacturing method for the semiconductor integrated circuit device according to the embodiment of the present application will be described based on the above drawings.

The chemical solution or pure water nozzle 128 (cleaning solution nozzle) explained in FIGS. 1, 6, 7, or the like will be described below in detail. The chemical solution nozzle may be the same as the pure water nozzle, or may be different from the pure water nozzle.

The cleaning solution nozzle of the first example will be shown in FIGS. 20A and 20B. In an actual case, the cleaning solution generally enters the main surface 1a of the wafer 1 with some inclination angle. In order to simplify a model, a case where the cleaning solution is vertically applied will be described. In such a circular single nozzle, the cleaning solution 129b entering the main surface 1a of the wafer 1 expands radially without changing its speed, regardless of viscosity or the like. At this time, since the continuity equations has to be satisfied, the thickness of the cleaning solution 129b becomes thinner as the cleaning solution radially goes toward the periphery. Thus, only the supply of the cleaning solution 129b generates nonuniformity of dissolved oxygen.

In a second example shown in FIGS. 21A and 21B, the adjustment of the shape or the like of the nozzle reduces nonuniformity of the dissolved oxygen. For example, as shown in FIGS. 21A and 21B, when collision sections 201a and 201b against which the cleaning solution 129b enters the main surface 1a of the wafer 1 from the nozzles 128a and 128b are formed in a substantially elongated elliptic shape or the like (note that when the sections of them are set to cross the wafer, the nozzles are very effective), the flow of the cleaning solution on the wafer becomes one-dimensional order. Thus, the thickness of the cleaning solution does not need to be thinned so as to satisfy a continuity equation. This does not generate nonuniform dissolved oxygen due to the nozzle. The length of the major axis of the elongated ellipse of each of the collision sections 201a and 201b is preferably three or more times, and more preferably five or more times as long as that of the minor axis of the ellipse.

Thus, the one-dimensional flow can be achieved by arranging a plurality of (at least two, preferable, three or more) cylindrical nozzles at regular intervals in the same way.

6. Explanation of Characteristic Data Regarding Device in Manufacturing Method for Semiconductor Integrated Circuit Device in One Embodiment of Present Application, and Consideration of Overall Embodiments (See Mainly FIGS. 22 and 25)

Figure 22:
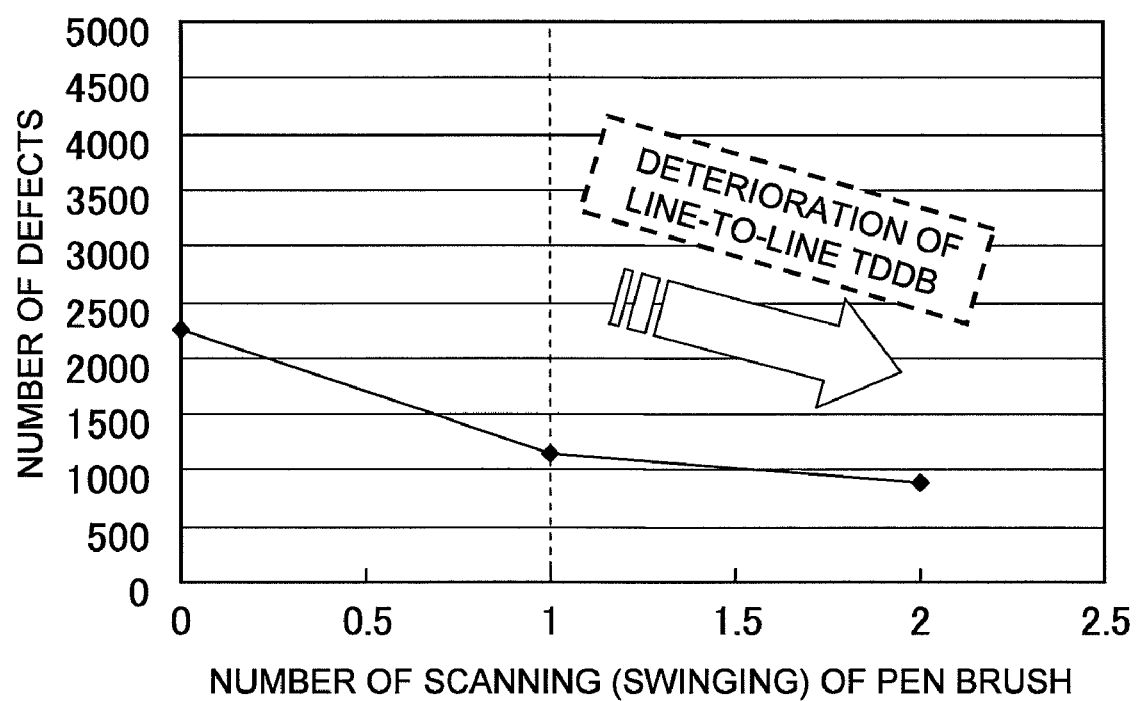
FIG. 22 is a plot diagram showing the relationship between the device characteristics and the number of scanning in cleaning with the pen brush after the CMP in the manufacturing method for the semiconductor integrated circuit device according to the embodiment of the present application.
Figure 23:
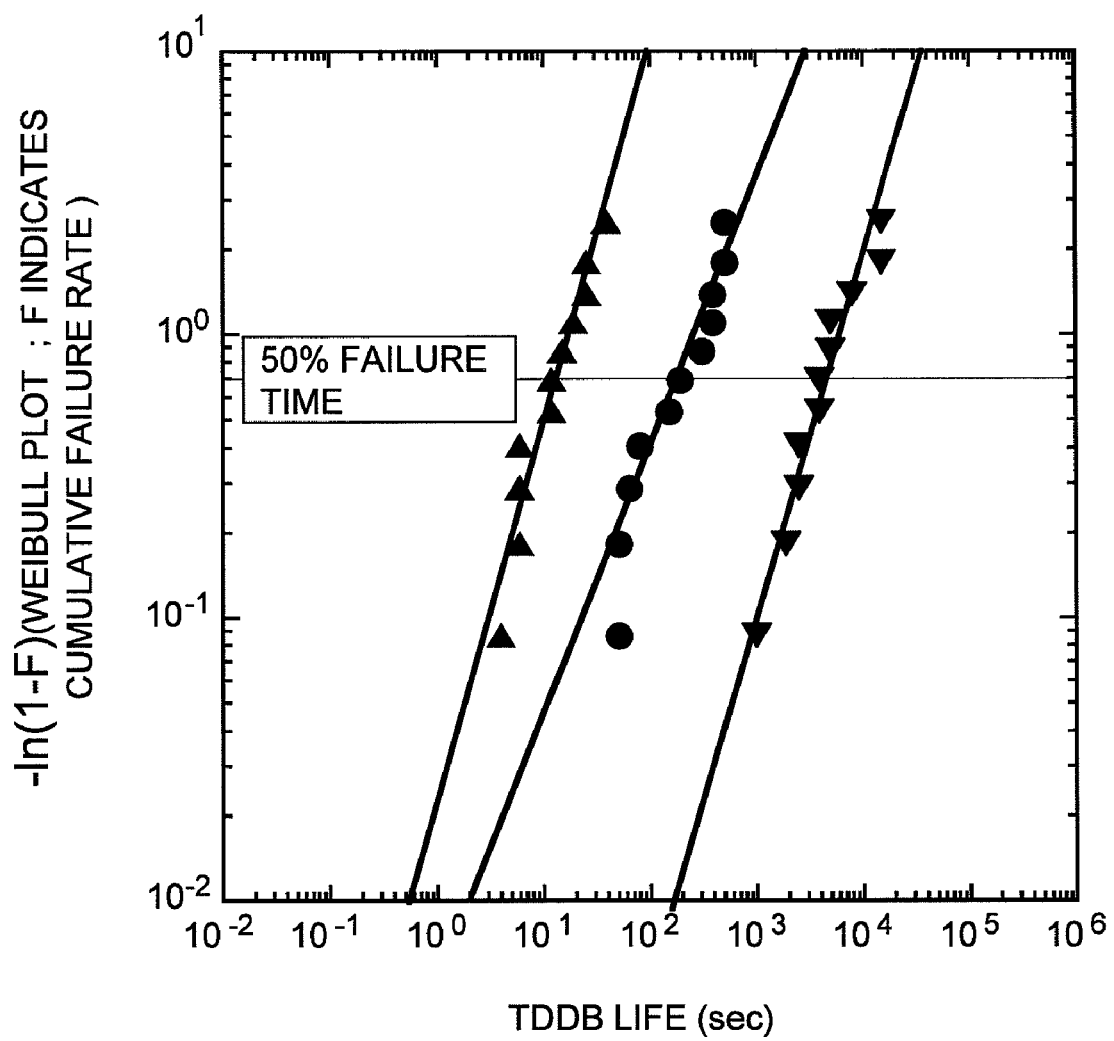
FIG. 23 is a plot diagram showing device characteristics in a wet cleaning method (which is currently performed as standard) after the CMP corresponding to a comparative example.
Figure 24:
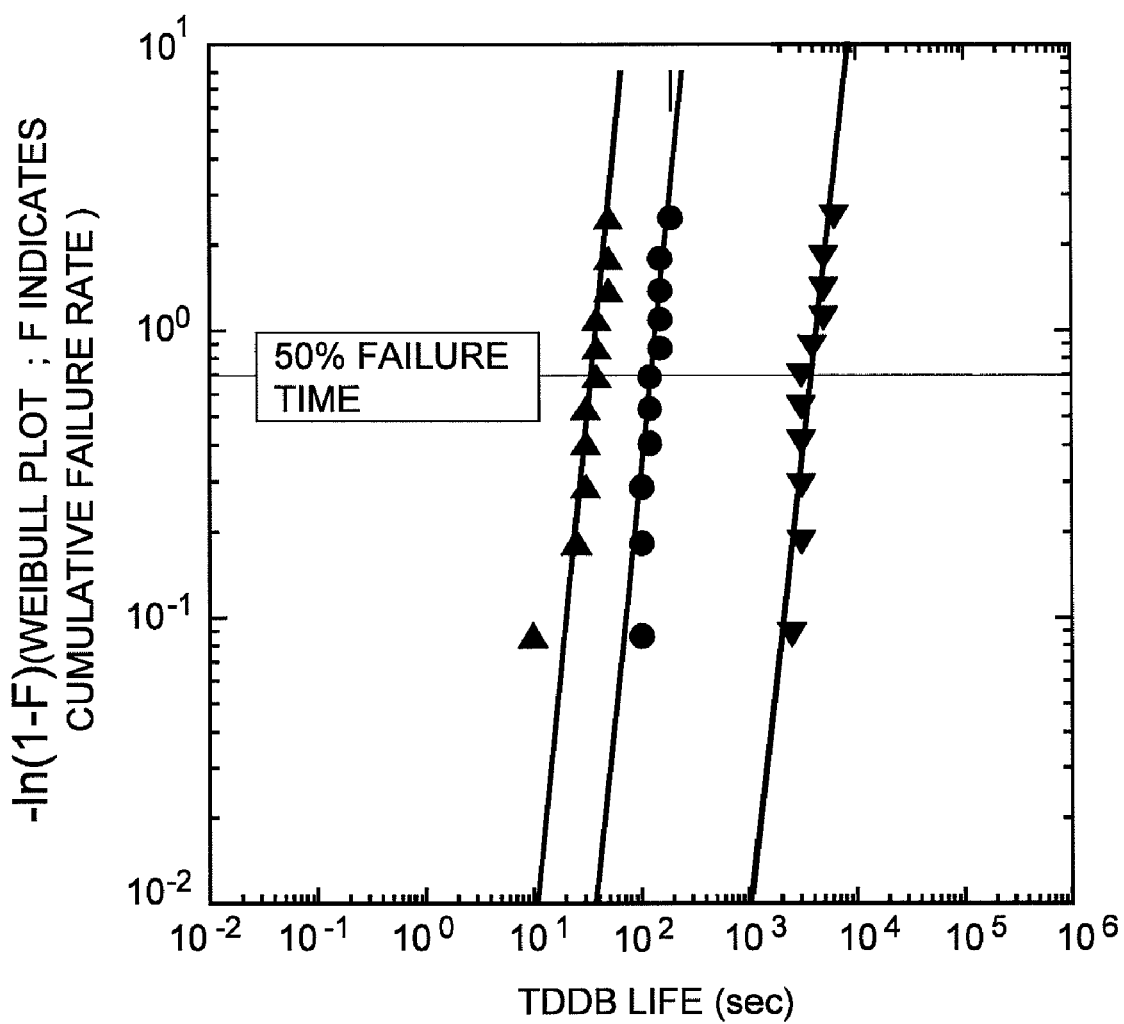
FIG. 24 is a plot diagram showing device characteristics in wet cleaning after the CMP in the manufacturing method for the semiconductor integrated circuit device according to the embodiment of the present application.

FIG. 22 is a plot diagram showing the relationship between the device characteristics and the number of scanning in cleaning with the pen brush after the CMP in the manufacturing method for the semiconductor integrated circuit device in the embodiment of the present application. FIG. 23 is a plot diagram showing device characteristics in a wet cleaning method (which is currently performed as standard) after the CMP corresponding to a comparative example. FIG. 24 is a plot diagram showing device characteristics in wet cleaning after the CMP in the manufacturing method for the semiconductor integrated circuit device in the embodiment of the present application. FIG. 25 is a table for explaining conditions of the comparative example, specifically, for explaining process conditions in the wet cleaning method after the CMP corresponding to the comparative example of FIG. 23. Based on these drawings, the device characteristic data or the like in the manufacturing method for the semiconductor integrated circuit device according to the embodiment of the present application will be described below.

First, FIG. 22 shows the number of swing (scanning) in cleaning with the pen brush, and the tradeoff relationship between the number of defaults on the wafer and a line-to-line time dependent dielectric breakdown (TDDB) of the device. The measurement is performed at 125 degrees C. using a pattern for evaluation of the line-to-line TDDB having an opposed length of 300 meters, and a line and space of 0.1 μm.

The result shows that the scanning with the brush relatively improves the effect of cleaning, but when the brush scanning is repeatedly performed, the corrosion of a wiring layer due to the nonuniform concentration of dissolved oxygen caused by the pen brush is promoted. Thus, a single scanning operation from the inside to the outer end designated by a broken line is desired. The number of scanning of a halfway value, for example, 0.5 or 1.5, which is a condition not excluded, cannot scan the entire wafer on the same condition, and may leave a certain kind of mark.

FIG. 23 shows a graph in which the horizontal axis indicates a TDDB lifetime (based on a pattern for evaluation of the line-to-line TDDB) of the device when applying the standard cleaning condition at present time (see FIG. 25 as the comparative example), and the vertical axis indicates a so-called Weibull Plot at a cumulative failure rate F. FIG. 24 corresponds to the wet cleaning method after the CMP according to the embodiment of the present application (see FIG. 9). The result specifically shows that a product lifetime (due to the line-to-line TDD failure) of 0.17 years on the standard cleaning condition is changed to that of 8900 years.

As compared to FIG. 25, the wet cleaning method after the CMP according to the embodiment of the present application will be described below with reference to FIG. 9.

First, attention should be paid to the fact that the speed of rotation of the wafer about its axis is extremely low in the wet cleaning method after the CMP according to the embodiment of the present application. This is due to the following reason. The high-speed rotation of the wafer about its axis makes the thickness of the cleaning solution film on the wafer nonuniform. An effect of involving oxygen caused by the rotation of the roll brush synergically acts together with the phenomenon of the nonuniform thickness to corrode wiring metal.

In each rinsing process, the phenomenon of the nonuniformity of the dissolved oxygen due to the brush does not occur, but it is necessary to pay attention to the phenomena of nonuniform thickness of the cleaning solution due to the nozzle and due to rotation of the wafer. Thus, also in the rinsing process, the rotation speed of the wafer is preferably low (in cleaning with the chemical solution and in rinsing or cleaning with pure water using the primary and secondary roll brushes, and in rinsing or cleaning with pure water using the pen brush).

It is noted that in the cleaning process with the chemical solution using the pen brush, the rotation of the wafer is set on a high-speed condition. This is because although the same low-speed condition is desirable from the viewpoint of corrosion, the low rotation speed of the wafer fails to scan the wafer area uniformly for a short time, which may cause the occurrence of scroll marks or the like. The cleaning with the pen brush is not essential, but can be operated to slightly compensate for reduction in cleaning effect which is caused by lowering the rotation speed of the wafer.

The number of revolutions of the roll brush is preferably set slightly high as compared to the case shown in FIG. 25. This is not essential, but can also be performed together with lowering of the rotation speed of the wafer about its axis thereby to slightly compensate for the reduction in cleaning effect.

The repeated cleaning including the chemical solution cleaning, and rising, that is, pure water cleaning with the primary and secondary roll brushes requires only one time roll brush cleaning with the chemical solution, and only one rinsing. In that case, the shortage of cleaning needs to be covered by the time. That is, two stages in use are currently arranged in series (which makes the flow in the device smooth). Alternatively, two stages may be in use arranged in parallel to each other by setting the time about twice as long as in the above case.

6. Summary

Although the invention made by the inventors has been specifically described above based on the exemplary embodiments, it will be understood by those skilled in the art that the invention is not limited thereto, and that various modifications can be made without departing from the spirit and scope of the invention.

For example, although the above embodiments have been specifically described by taking 300 φ wafer as one example, it is apparent that the invention can also be applied to 450 φ wafer or 200 φ wafer in the substantially same way. Although in the above embodiments a copper dual damascene process has been specifically described, it is apparent that the invention can also be applied to a copper single damascene process, a dual damascene process using silver or the like, and another single damascene process. Although in the above embodiments, the SiOC film or FSG film is mainly accommodated as the main interlayer insulating film, the invention of the present application is not limited to those using them. It is apparent that the invention can also be applied to any films using other main interlayer insulating film materials, any films using porous main interlayer insulating materials and the like.

What is claimed is:

1. A manufacturing method for a semiconductor integrated circuit device, comprising:
   (a) forming a wiring trench in a first insulating film over a first main surface of a wafer;
   (b) forming a metal member layer in the wiring trench and over the first insulating film so as to fill the wiring trench therewith;
   (c) forming an embedded wiring by removing the metal member layer located outside the wiring trench by a CMP process;
   (d) after the step (c), applying a wet cleaning process to the first main surface side of the wafer with the embedded wiring formed therein while rotating the wafer about an axis thereof in a plane including the first main surface; and
   (e) after the step (d), drying the first main surface side of the wafer,
   wherein the wet cleaning process comprises the steps of
      (d1) a first chemical solution cleaning process performed by a first rotary roll brush;
      (d2) a second chemical solution cleaning process performed by a second rotary roll brush after the first chemical solution cleaning process;
      (d3) a third chemical solution cleaning process performed by a rotary pen brush after the second chemical solution cleaning process;
      (d4) a first rinsing process performed without a brush after the third chemical solution cleaning process;
      (d5) a second rinsing process performed without a brush between the second chemical solution cleaning process and the third chemical solution cleaning process; and
      (d6) a third rinsing process performed without a brush between the first chemical solution cleaning process and the second chemical solution cleaning process,
   wherein a rotation speed of the wafer about the axis thereof is from four times per minute to 16 times per minute in the steps (d1), (d2), (d4), (d5), and (d6), and
   wherein a rotation speed of the wafer about the axis thereof in the step (d3) is higher than the rotation speed of the wafer in the steps (d1), (d2), (d4), (d5), and (d6).

* * * * *